United States Patent [19]
Ino

[11] Patent Number: 6,154,504
[45] Date of Patent: Nov. 28, 2000

[54] ENCODING METHOD, ENCODING APPARATUS, DECODING METHOD, DECODING APPARATUS, AND RECORDING MEDIUM

[75] Inventor: Hiroyuki Ino, Gunma, Japan

[73] Assignee: Sony Corporation, Tokyo, Japan

[21] Appl. No.: 08/987,871

[22] Filed: Dec. 9, 1997

[30] Foreign Application Priority Data

Dec. 10, 1996 [JP] Japan .................................. 8-329376

[51] Int. Cl.[7] ................................................ H04L 5/12
[52] U.S. Cl. ........................ 375/265; 375/262; 375/295; 375/341; 714/791
[58] Field of Search .................................. 375/262, 295, 375/341, 265; 714/791, 792, 788, 780

[56] References Cited

U.S. PATENT DOCUMENTS

| | | | |
|---|---|---|---|
| 5,095,484 | 3/1992 | Karabed et al. | 371/30 |
| 5,280,489 | 1/1994 | Fredrickson et al. | 714/788 |
| 5,379,306 | 1/1995 | Noma et al. | 714/792 |
| 5,548,800 | 8/1996 | Fredrickson et al. | 714/791 |
| 5,781,590 | 7/1998 | Shiokawa et al. | 375/341 |

OTHER PUBLICATIONS

H. Thapar et al., "On the Performance of a Rate 8/10 Matched Spectral Null Code for Class–4 Partial Response," IEEE Transactions on Magnetics, vol. 28, No. 5, Sep. 1992, pp. 2883–2888.

L. Fredrickson et al., "Improved Trellis–Coding for Partial–Response Channels," IEEE Transactions on Magnetics, vol. 31, No. 2, Mar. 1995, pp. 1141–1148.

*Primary Examiner*—Stephen Chin
*Assistant Examiner*—Shuwang Liu
*Attorney, Agent, or Firm*—Limbach & Limbach L.L.P.; Seong-Kun Oh

[57] ABSTRACT

Partial response (1, 1) is applied to a partitioned MSN (partitioned-matched spectral null) code. A branch metric (BM) obtained in a calculation block is directly supplied to a selector, and it is also supplied to the selector via an adder. The adder adds a predetermined value to the branch metric in such a manner as to decrease the degree of likelihood associated with a state transition corresponding to the branch metric. A determination block detects an invalid state transition in a detection trellis, which cannot be generated by the partitioned MSN code, on the basis of the number of 1s or 0s included in the partitioned MSN code. The selector selects either the branch metric added with the predetermined value or the branch metric added with no predetermined value depending on the detection result of the determination block. A path metric is calculated using the selected branch metric added with the predetermined value or added with no predetermined value.

42 Claims, 34 Drawing Sheets

FIG. 8

| 8-BIT DATA | 10-BIT CODE | RDS AT END BIT | | 8-BIT DATA | 10-BIT CODE | RDS AT END BIT |
|---|---|---|---|---|---|---|
| 0 | 0100101110 | 3 | | 35 | 0110001111 | 5 |
| 1 | 0100101111 | 5 | | 36 | 0110010110 | 3 |
| 2 | 0100110110 | 3 | | 37 | 0110010111 | 5 |
| 3 | 0100110111 | 5 | | 38 | 0110011010 | 3 |
| 4 | 0100111010 | 3 | | 39 | 0110011011 | 5 |
| 5 | 0100111011 | 5 | | 40 | 0110011100 | 3 |
| 6 | 0100111100 | 3 | | 41 | 0110011101 | 5 |
| 7 | 0100111101 | 5 | | 42 | 0110011110 | 5 |
| 8 | 0100111110 | 5 | | 43 | 0110100110 | 3 |
| 9 | 0101001110 | 3 | | 44 | 0110100111 | 5 |
| 10 | 0101001111 | 5 | | 45 | 0110101010 | 3 |
| 11 | 0101010110 | 3 | | 46 | 0110101011 | 5 |
| 12 | 0101010111 | 5 | | 47 | 0110101100 | 3 |
| 13 | 0101011010 | 3 | | 48 | 0110101101 | 5 |
| 14 | 0101011011 | 5 | | 49 | 0110101110 | 5 |
| 15 | 0101011100 | 3 | | 50 | 0110110010 | 3 |
| 16 | 0101011101 | 5 | | 51 | 0110110011 | 5 |
| 17 | 0101011110 | 5 | | 52 | 0110110100 | 3 |
| 18 | 0101100110 | 3 | | 53 | 0110110101 | 5 |
| 19 | 0101100111 | 5 | | 54 | 0110110110 | 5 |
| 20 | 0101101010 | 3 | | 55 | 0110111000 | 3 |
| 21 | 0101101011 | 5 | | 56 | 0110111001 | 5 |
| 22 | 0101101100 | 3 | | 57 | 0110111010 | 5 |
| 23 | 0101101101 | 5 | | 58 | 0110111100 | 5 |
| 24 | 0101101110 | 5 | | 59 | 0111000110 | 3 |
| 25 | 0101110010 | 3 | | 60 | 0111000111 | 5 |
| 26 | 0101110011 | 5 | | 61 | 0111001010 | 3 |
| 27 | 0101110100 | 3 | | 62 | 0111001011 | 5 |
| 28 | 0101110101 | 5 | | 63 | 0111001100 | 3 |
| 29 | 0101110110 | 5 | | 64 | 0111001101 | 5 |
| 30 | 0101111000 | 3 | | 65 | 0111001110 | 5 |
| 31 | 0101111001 | 5 | | | | |
| 32 | 0101111010 | 5 | | | | |
| 33 | 0101111100 | 5 | | | | |
| 34 | 0110001110 | 3 | | | | |

FIG. 9

| 8-BIT DATA | 10-BIT CODE | RDS AT END BIT | 8-BIT DATA | 10-BIT CODE | RDS AT END BIT |
|---|---|---|---|---|---|
| 66 | 0111010010 | 3 | 101 | 1001011010 | 3 |
| 67 | 0111010011 | 5 | 102 | 1001011011 | 5 |
| 68 | 0111010100 | 3 | 103 | 1001011100 | 3 |
| 69 | 0111010101 | 5 | 104 | 1001011101 | 5 |
| 70 | 0111010110 | 5 | 105 | 1001011110 | 5 |
| 71 | 0111011000 | 3 | 106 | 1001100110 | 3 |
| 72 | 0111011001 | 5 | 107 | 1001100111 | 5 |
| 73 | 0111011010 | 5 | 108 | 1001101010 | 3 |
| 74 | 0111011100 | 5 | 109 | 1001101011 | 5 |
| 75 | 0111100010 | 3 | 110 | 1001101100 | 3 |
| 76 | 0111100011 | 5 | 111 | 1001101101 | 5 |
| 77 | 0111100100 | 3 | 112 | 1001101110 | 5 |
| 78 | 0111100101 | 5 | 113 | 1001110010 | 3 |
| 79 | 0111100110 | 5 | 114 | 1001110011 | 5 |
| 80 | 0111101000 | 3 | 115 | 1001110100 | 3 |
| 81 | 0111101001 | 5 | 116 | 1001110101 | 5 |
| 82 | 0111101010 | 5 | 117 | 1001110110 | 5 |
| 83 | 0111101100 | 5 | 118 | 1001111000 | 3 |
| 84 | 0111110000 | 3 | 119 | 1001111001 | 5 |
| 85 | 0111110001 | 5 | 120 | 1001111010 | 5 |
| 86 | 0111110010 | 5 | 121 | 1001111100 | 5 |
| 87 | 0111110100 | 5 | 122 | 1010001110 | 3 |
| 88 | 1000101110 | 3 | 123 | 1010001111 | 5 |
| 89 | 1000101111 | 5 | 124 | 1010010110 | 3 |
| 90 | 1000110110 | 3 | 125 | 1010010111 | 5 |
| 91 | 1000110111 | 5 | 126 | 1010011010 | 3 |
| 92 | 1000111010 | 3 | 127 | 1010011011 | 5 |
| 93 | 1000111011 | 5 | 128 | 1010011100 | 3 |
| 94 | 1000111100 | 3 | 129 | 1010011101 | 5 |
| 95 | 1000111101 | 5 | 130 | 1010011110 | 5 |
| 96 | 1000111110 | 5 | 131 | 1010100110 | 3 |
| 97 | 1001001110 | 3 | | | |
| 98 | 1001001111 | 5 | | | |
| 99 | 1001010110 | 3 | | | |
| 100 | 1001010111 | 5 | | | |

FIG. 10

| 8-BIT DATA | 10-BIT CODE | RDS AT END BIT | 8-BIT DATA | 10-BIT CODE | RDS AT END BIT |
|---|---|---|---|---|---|
| 132 | 1010100111 | 5 | 167 | 1011100110 | 5 |
| 133 | 1010101010 | 3 | 168 | 1011101000 | 3 |
| 134 | 1010101011 | 5 | 169 | 1011101001 | 5 |
| 135 | 1010101100 | 3 | 170 | 1011101010 | 5 |
| 136 | 1010101101 | 5 | 171 | 1011101100 | 5 |
| 137 | 1010101110 | 5 | 172 | 1011110000 | 3 |
| 138 | 1010110010 | 3 | 173 | 1011110001 | 5 |
| 139 | 1010110011 | 5 | 174 | 1011110010 | 5 |
| 140 | 1010110100 | 3 | 175 | 1011110100 | 5 |
| 141 | 1010110101 | 5 | 176 | 1100001110 | 3 |
| 142 | 1010110110 | 5 | 177 | 1100001111 | 5 |
| 143 | 1010111000 | 3 | 178 | 1100010110 | 3 |
| 144 | 1010111001 | 5 | 179 | 1100010111 | 5 |
| 145 | 1010111010 | 5 | 180 | 1100011010 | 3 |
| 146 | 1010111100 | 5 | 181 | 1100011011 | 5 |
| 147 | 1011000110 | 3 | 182 | 1100011100 | 3 |
| 148 | 1011000111 | 5 | 183 | 1100011101 | 5 |
| 149 | 1011001010 | 3 | 184 | 1100011110 | 5 |
| 150 | 1011001011 | 5 | 185 | 1100100110 | 3 |
| 151 | 1011001100 | 3 | 186 | 1100100111 | 5 |
| 152 | 1011001101 | 5 | 187 | 1100101010 | 3 |
| 153 | 1011001110 | 5 | 188 | 1100101011 | 5 |
| 154 | 1011010010 | 3 | 189 | 1100101100 | 3 |
| 155 | 1011010011 | 5 | 190 | 1100101101 | 5 |
| 156 | 1011010100 | 3 | 191 | 1100101110 | 5 |
| 157 | 1011010101 | 5 | 192 | 1100110010 | 3 |
| 158 | 1011010110 | 5 | 193 | 1100110011 | 5 |
| 159 | 1011011000 | 3 | 194 | 1100110100 | 3 |
| 160 | 1011011001 | 5 | 195 | 1100110101 | 5 |
| 161 | 1011011010 | 5 | 196 | 1100110110 | 5 |
| 162 | 1011011100 | 5 | 197 | 1100111000 | 3 |
| 163 | 1011100010 | 3 | | | |
| 164 | 1011100011 | 5 | | | |
| 165 | 1011100100 | 3 | | | |
| 166 | 1011100101 | 5 | | | |

FIG. 11

| 8-BIT DATA | 10-BIT CODE | RDS AT END BIT | 8-BIT DATA | 10-BIT CODE | RDS AT END BIT |
|---|---|---|---|---|---|
| 198 | 1100111001 | 5 | 234 | 1110001100 | 3 |
| 199 | 1100111010 | 5 | 235 | 1110001101 | 5 |
| 200 | 1100111100 | 5 | 236 | 1110001110 | 5 |
| 201 | 1101000110 | 3 | 237 | 1110010010 | 3 |
| 202 | 1101000111 | 5 | 238 | 1110010011 | 5 |
| 203 | 1101001010 | 3 | 239 | 1110010100 | 3 |
| 204 | 1101001011 | 5 | 240 | 1110010101 | 5 |
| 205 | 1101001100 | 3 | 241 | 1110010110 | 5 |
| 206 | 1101001101 | 5 | 242 | 1110011000 | 3 |
| 207 | 1101001110 | 5 | 243 | 1110011001 | 5 |
| 208 | 1101010010 | 3 | 244 | 1110011010 | 5 |
| 209 | 1101010011 | 5 | 245 | 1110011100 | 5 |
| 210 | 1101010100 | 3 | 246 | 1110100010 | 3 |
| 211 | 1101010101 | 5 | 247 | 1110100011 | 5 |
| 212 | 1101010110 | 5 | 248 | 1110100100 | 3 |
| 213 | 1101011000 | 3 | 249 | 1110100101 | 5 |
| 214 | 1101011001 | 5 | 250 | 1110100110 | 5 |
| 215 | 1101011010 | 5 | 251 | 1110101000 | 3 |
| 216 | 1101011100 | 5 | 252 | 1110101001 | 5 |
| 217 | 1101100010 | 3 | 253 | 1110101010 | 5 |
| 218 | 1101100011 | 5 | 254 | 1110101100 | 5 |
| 219 | 1101100100 | 3 | 255 | 1110110000 | 3 |
| 220 | 1101100101 | 5 | 256 | 1110110001 | 5 |
| 221 | 1101100110 | 5 | 257 | 1110110010 | 5 |
| 222 | 1101101000 | 3 | 258 | 1110110100 | 5 |
| 223 | 1101101001 | 5 | | | |
| 224 | 1101101010 | 5 | | | |
| 225 | 1101101100 | 5 | | | |
| 226 | 1101110000 | 3 | | | |
| 227 | 1101110001 | 5 | | | |
| 228 | 1101110010 | 5 | | | |
| 229 | 1101110100 | 5 | | | |
| 230 | 1110000110 | 3 | | | |
| 231 | 1110000111 | 5 | | | |
| 232 | 1110001010 | 3 | | | |
| 233 | 1110001011 | 5 | | | |

FIG. 12

| 8-BIT DATA | 10-BIT CODE | RDS AT END BIT | 8-BIT DATA | 10-BIT CODE | RDS AT END BIT |
|---|---|---|---|---|---|
| 0 | 1011010001 | 5 | 35 | 1001110000 | 3 |
| 1 | 1011010000 | 3 | 36 | 1001101001 | 5 |
| 2 | 1011001001 | 5 | 37 | 1001101000 | 3 |
| 3 | 1011001000 | 3 | 38 | 1001100101 | 5 |
| 4 | 1011000101 | 5 | 39 | 1001100100 | 3 |
| 5 | 1011000100 | 3 | 40 | 1001100011 | 5 |
| 6 | 1011000011 | 5 | 41 | 1001100010 | 3 |
| 7 | 1011000010 | 3 | 42 | 1001100001 | 3 |
| 8 | 1011000001 | 3 | 43 | 1001011001 | 5 |
| 9 | 1010110001 | 5 | 44 | 1001011000 | 3 |
| 10 | 1010110000 | 3 | 45 | 1001010101 | 5 |
| 11 | 1010101001 | 5 | 46 | 1001010100 | 3 |
| 12 | 1010101000 | 3 | 47 | 1001010011 | 5 |
| 13 | 1010100101 | 5 | 48 | 1001010010 | 3 |
| 14 | 1010100100 | 3 | 49 | 1001010001 | 3 |
| 15 | 1010100011 | 5 | 50 | 1001001101 | 5 |
| 16 | 1010100010 | 3 | 51 | 1001001100 | 3 |
| 17 | 1010100001 | 3 | 52 | 1001001011 | 5 |
| 18 | 1010011001 | 5 | 53 | 1001001010 | 3 |
| 19 | 1010011000 | 3 | 54 | 1001001001 | 3 |
| 20 | 1010010101 | 5 | 55 | 1001000111 | 5 |
| 21 | 1010010100 | 3 | 56 | 1001000110 | 3 |
| 22 | 1010010011 | 5 | 57 | 1001000101 | 3 |
| 23 | 1010010010 | 3 | 58 | 1001000011 | 3 |
| 24 | 1010010001 | 3 | 59 | 1000111001 | 5 |
| 25 | 1010001101 | 5 | 60 | 1000111000 | 3 |
| 26 | 1010001100 | 3 | 61 | 1000110101 | 5 |
| 27 | 1010001011 | 5 | 62 | 1000110100 | 3 |
| 28 | 1010001010 | 3 | 63 | 1000110011 | 5 |
| 29 | 1010001001 | 3 | 64 | 1000110010 | 3 |
| 30 | 1010000111 | 5 | 65 | 1000110001 | 3 |
| 31 | 1010000110 | 3 | | | |
| 32 | 1010000101 | 3 | | | |
| 33 | 1010000011 | 3 | | | |
| 34 | 1001110001 | 5 | | | |

FIG. 13

| 8-BIT DATA | 10-BIT CODE | RDS AT END BIT | 8-BIT DATA | 10-BIT CODE | RDS AT END BIT |
|---|---|---|---|---|---|
| 66 | 1000101101 | 5 | 101 | 0110100101 | 5 |
| 67 | 1000101100 | 3 | 102 | 0110100100 | 3 |
| 68 | 1000101011 | 5 | 103 | 0110100011 | 5 |
| 69 | 1000101010 | 3 | 104 | 0110100010 | 3 |
| 70 | 1000101001 | 3 | 105 | 0110100001 | 3 |
| 71 | 1000100111 | 5 | 106 | 0110011001 | 5 |
| 72 | 1000100110 | 3 | 107 | 0110011000 | 3 |
| 73 | 1000100101 | 3 | 108 | 0110010101 | 5 |
| 74 | 1000100011 | 3 | 109 | 0110010100 | 3 |
| 75 | 1000011101 | 5 | 110 | 0110010011 | 5 |
| 76 | 1000011100 | 3 | 111 | 0110010010 | 3 |
| 77 | 1000011011 | 5 | 112 | 0110010001 | 3 |
| 78 | 1000011010 | 3 | 113 | 0110001101 | 5 |
| 79 | 1000011001 | 3 | 114 | 0110001100 | 3 |
| 80 | 1000010111 | 5 | 115 | 0110001011 | 5 |
| 81 | 1000010110 | 3 | 116 | 0110001010 | 3 |
| 82 | 1000010101 | 3 | 117 | 0110001001 | 3 |
| 83 | 1000010011 | 3 | 118 | 0110000111 | 5 |
| 84 | 1000001111 | 5 | 119 | 0110000110 | 3 |
| 85 | 1000001110 | 3 | 120 | 0110000101 | 3 |
| 86 | 1000001101 | 3 | 121 | 0110000011 | 3 |
| 87 | 1000001011 | 3 | 122 | 0101110001 | 5 |
| 88 | 0111010001 | 5 | 123 | 0101110000 | 3 |
| 89 | 0111010000 | 3 | 124 | 0101101001 | 5 |
| 90 | 0111001001 | 5 | 125 | 0101101000 | 3 |
| 91 | 0111001000 | 3 | 126 | 0101100101 | 5 |
| 92 | 0111000101 | 5 | 127 | 0101100100 | 3 |
| 93 | 0111000100 | 3 | 128 | 0101100011 | 5 |
| 94 | 0111000011 | 5 | 129 | 0101100010 | 3 |
| 95 | 0111000010 | 3 | 130 | 0101100001 | 3 |
| 96 | 0111000001 | 3 | 131 | 0101011001 | 5 |
| 97 | 0110110001 | 5 | | | |
| 98 | 0110110000 | 3 | | | |
| 99 | 0110101001 | 5 | | | |
| 100 | 0110101000 | 3 | | | |

FIG. 14

| 8-BIT DATA | 10-BIT CODE | RDS AT END BIT | | 8-BIT DATA | 10-BIT CODE | RDS AT END BIT |
|---|---|---|---|---|---|---|
| 132 | 0101011000 | 3 | | 167 | 0100011001 | 3 |
| 133 | 0101010101 | 5 | | 168 | 0100010111 | 5 |
| 134 | 0101010100 | 3 | | 169 | 0100010110 | 3 |
| 135 | 0101010011 | 5 | | 170 | 0100010101 | 3 |
| 136 | 0101010010 | 3 | | 171 | 0100010011 | 3 |
| 137 | 0101010001 | 3 | | 172 | 0100001111 | 5 |
| 138 | 0101001101 | 5 | | 173 | 0100001110 | 3 |
| 139 | 0101001100 | 3 | | 174 | 0100001101 | 3 |
| 140 | 0101001011 | 5 | | 175 | 0100001011 | 3 |
| 141 | 0101001010 | 3 | | 176 | 0011110001 | 5 |
| 142 | 0101001001 | 3 | | 177 | 0011110000 | 3 |
| 143 | 0101000111 | 5 | | 178 | 0011101001 | 5 |
| 144 | 0101000110 | 3 | | 179 | 0011101000 | 3 |
| 145 | 0101000101 | 3 | | 180 | 0011100101 | 5 |
| 146 | 0101000011 | 3 | | 181 | 0011100100 | 3 |
| 147 | 0100111001 | 5 | | 182 | 0011100011 | 5 |
| 148 | 0100111000 | 3 | | 183 | 0011100010 | 3 |
| 149 | 0100110101 | 5 | | 184 | 0011100001 | 3 |
| 150 | 0100110100 | 3 | | 185 | 0011011001 | 5 |
| 151 | 0100110011 | 5 | | 186 | 0011011000 | 3 |
| 152 | 0100110010 | 3 | | 187 | 0011010101 | 5 |
| 153 | 0100110001 | 3 | | 188 | 0011010100 | 3 |
| 154 | 0100101101 | 5 | | 189 | 0011010011 | 5 |
| 155 | 0100101100 | 3 | | 190 | 0011010010 | 3 |
| 156 | 0100101011 | 5 | | 191 | 0011010001 | 3 |
| 157 | 0100101010 | 3 | | 192 | 0011001101 | 5 |
| 158 | 0100101001 | 3 | | 193 | 0011001100 | 3 |
| 159 | 0100100111 | 5 | | 194 | 0011001011 | 5 |
| 160 | 0100100110 | 3 | | 195 | 0011001010 | 3 |
| 161 | 0100100101 | 3 | | 196 | 0011001001 | 3 |
| 162 | 0100100011 | 3 | | 197 | 0011000111 | 5 |
| 163 | 0100011101 | 5 | | | | |
| 164 | 0100011100 | 3 | | | | |
| 165 | 0100011011 | 5 | | | | |
| 166 | 0100011010 | 3 | | | | |

FIG. 15

| 8-BIT DATA | 10-BIT CODE | RDS AT END BIT | 8-BIT DATA | 10-BIT CODE | RDS AT END BIT |
|---|---|---|---|---|---|
| 198 | 0011000110 | 3 | 234 | 0001110011 | 5 |
| 199 | 0011000101 | 3 | 235 | 0001110010 | 3 |
| 200 | 0011000011 | 3 | 236 | 0001110001 | 3 |
| 201 | 0010111001 | 5 | 237 | 0001101101 | 5 |
| 202 | 0010111000 | 3 | 238 | 0001101100 | 3 |
| 203 | 0010110101 | 5 | 239 | 0001101011 | 5 |
| 204 | 0010110100 | 3 | 240 | 0001101010 | 3 |
| 205 | 0010110011 | 5 | 241 | 0001101001 | 3 |
| 206 | 0010110010 | 3 | 242 | 0001100111 | 5 |
| 207 | 0010110001 | 3 | 243 | 0001100110 | 3 |
| 208 | 0010101101 | 5 | 244 | 0001100101 | 3 |
| 209 | 0010101100 | 3 | 245 | 0001100011 | 3 |
| 210 | 0010101011 | 5 | 246 | 0001011101 | 5 |
| 211 | 0010101010 | 3 | 247 | 0001011100 | 3 |
| 212 | 0010101001 | 3 | 248 | 0001011011 | 5 |
| 213 | 0010100111 | 5 | 249 | 0001011010 | 3 |
| 214 | 0010100110 | 3 | 250 | 0001011001 | 3 |
| 215 | 0010100101 | 3 | 251 | 0001010111 | 5 |
| 216 | 0010100011 | 3 | 252 | 0001010110 | 3 |
| 217 | 0010011101 | 5 | 253 | 0001010101 | 3 |
| 218 | 0010011100 | 3 | 254 | 0001010011 | 3 |
| 219 | 0010011011 | 5 | 255 | 0001001111 | 5 |
| 220 | 0010011010 | 3 | 256 | 0001001110 | 3 |
| 221 | 0010011001 | 3 | 257 | 0001001101 | 3 |
| 222 | 0010010111 | 5 | 258 | 0001001011 | 3 |
| 223 | 0010010110 | 3 | | | |
| 224 | 0010010101 | 3 | | | |
| 225 | 0010010011 | 3 | | | |
| 226 | 0010001111 | 5 | | | |
| 227 | 0010001110 | 3 | | | |
| 228 | 0010001101 | 3 | | | |
| 229 | 0010001011 | 3 | | | |
| 230 | 0001111001 | 5 | | | |
| 231 | 0001111000 | 3 | | | |
| 232 | 0001110101 | 5 | | | |
| 233 | 0001110100 | 3 | | | |

B=7, H6e=3, H6o=0 → BR66
B=7, H6e=1, H6o=3 → BR67
B=7, H6e=2, H6o=3 → BR67
B=7, H7e=1, H7o=3 → BR77
B=7, H7e=2, H7o=3 → BR77
B=7, H8e=2, H8o=3 → BR89
B=7, H8e=3, H8o=3 → BR89
B=7, H9e=2, H9o=3 → BR99
B=7, H9e=3, H9o=3 → BR99
B=7, Hae=3, Hao=0 → BRab

B=8, H1e=1, H1o=2 → BR11
B=8, H2e=1, H2o=2 → BR21
B=8, H3e=1, H3o=3 → BR33
B=8, H4e=1, H4o=3 → BR43

B=8, H7e=3, H7o=1 → BR78
B=8, H8e=3, H8o=1 → BR88
B=8, H9e=3, H9o=2 → BR9a
B=8, Hae=3, Hao=2 → BRaa

B=12, H6e=4, H6o=1 → BR66
B=12, H6e=5, H6o=1 → BR66
B=12, H6e=5, H6o=2 → BR66
B=12, H7e=4, H7o=2 → BR78
B=12, H7e=5, H7o=2 → BR78
B=12, H7e=5, H7o=3 → BR78
B=12, H8e=4, H8o=2 → BR88
B=12, H8e=5, H8o=2 → BR88
B=12, H8e=5, H8o=3 → BR88
B=12, H9e=4, H9o=3 → BR9a
B=12, H9e=5, H9o=3 → BR9a
B=12, H9e=5, H9o=4 → BR9a
B=12, Hae=4, Hao=3 → BRaa
B=12, Hae=5, Hao=3 → BRaa
B=12, Hae=5, Hao=4 → BRaa

B=14,  H5e=4,  H5o=2  → BR56
B=14,  H6e=4,  H6o=2  → BR66
B=14,  H7e=4,  H7o=3  → BR76
B=14,  H8e=4,  H8o=3  → BR88
B=14,  H9e=4,  H9o=4  → BR9a
B=14,  H9e=4,  H9o=5  → BR9a
B=14,  Hae=4,  Hao=4  → BRaa
B=14,  Hae=4,  Hao=5  → BRaa

B=15,  H1e=2,  H1o=3  → BR10
B=15,  H2e=3,  H2o=3  → BR22
B=15,  H2e=4,  H2o=3  → BR22
B=15,  H3e=3,  H3o=3  → BR32
B=15,  H3e=4,  H3o=3  → BR32
B=15,  H4e=5,  H4o=3  → BR44
B=15,  H5e=6,  H5o=3  → BR54
B=15,  H5e=2,  H5o=4  → BR55

B=15,  H6e=6,  H6o=3  → BR66
B=15,  H6e=3,  H6o=4  → BR67
B=15,  H7e=3,  H7o=4  → BR77
B=15,  H8e=4,  H8o=4  → BR88
B=15,  H8e=5,  H8o=4  → BR89
B=15,  H9e=4,  H9o=4  → BR99
B=15,  H9e=5,  H9o=4  → BR99
B=15,  Hae=6,  Hao=4  → BRab

```
B=16, H8e=6, H8o=3 → BR88
B=16, H8e=6, H8o=4 → BR88
B=16, H9e=4, H9o=6 → BR9a
B=16, H9e=6, H9o=4 → BR9a
B=16, H9e=6, H9o=5 → BR9a
B=16, Hae=6, Hao=4 → BRaa
B=16, Hae=6, Hao=5 → BRaa

B=17, H2e=3, H2o=4 → BR22
B=17, H2e=4, H2o=2 → BR22
B=17, H2e=5, H2o=2 → BR22
B=17, H3e=3, H3o=4 → BR32
B=17, H3e=4, H3o=2 → BR32
B=17, H3e=5, H3o=2 → BR32
B=17, H4e=4, H4o=4 → BR44
B=17, H4e=5, H4o=4 → BR44
B=17, H4e=6, H4o=2 → BR44
B=17, H5e=4, H5o=4 → BR54
B=17, H5e=5, H5o=4 → BR54
B=17, H5e=5, H5o=2 → BR54
B=17, H4e=3, H4o=4 → BR45
B=17, H5e=3, H5o=4 → BR55

B=17, H6e=6, H6o=4 → BR66
B=17, H7e=6, H7o=4 → BR76
B=17, H5e=3, H6o=5 → BR67
B=17, H6e=4, H6o=4 → BR67
B=17, H6e=5, H6o=4 → BR67
B=17, H7e=3, H7o=6 → BR77
B=17, H7e=4, H7o=4 → BR77
B=17, H7e=5, H7o=4 → BR77
B=17, H8e=4, H8o=5 → BR89
B=17, H8e=5, H8o=6 → BR89
B=17, H8e=6, H8o=4 → BR89
B=17, H9e=4, H9o=6 → BR99
B=17, H9e=5, H9o=6 → BR99
B=17, H9e=6, H9o=4 → BR99

B=18, H3e=3, H3o=4 → BR33
B=18, H3e=3, H3o=5 → BR33
B=18, H4e=3, H4o=4 → BR43
B=18, H4e=3, H4o=5 → BR43
B=18, H5e=3, H5o=6 → BR55
B=18, H6e=3, H8o=6 → BR65

B=18, H5e=6, H5o=3 → BR56
B=18, H5e=8, H6o=3 → BR66
B=18, H7e=8, H7o=4 → BR78
B=18, H7e=6, H7o=5 → BR78
B=18, H8e=6, H8o=4 → BR88
B=18, H8e=6, H8o=5 → BR88

B=19, H4e=5, H4o=3 → BR44
B=19, H4e=5, H4o=3 → BR44
B=19, H5e=5, H5o=3 → BR54

B=19, H6e=4, H6o=6 → BR67
B=19, H7e=4, H7o=6 → BR77
B=19, H7e=5, H7o=6 → BR77
```

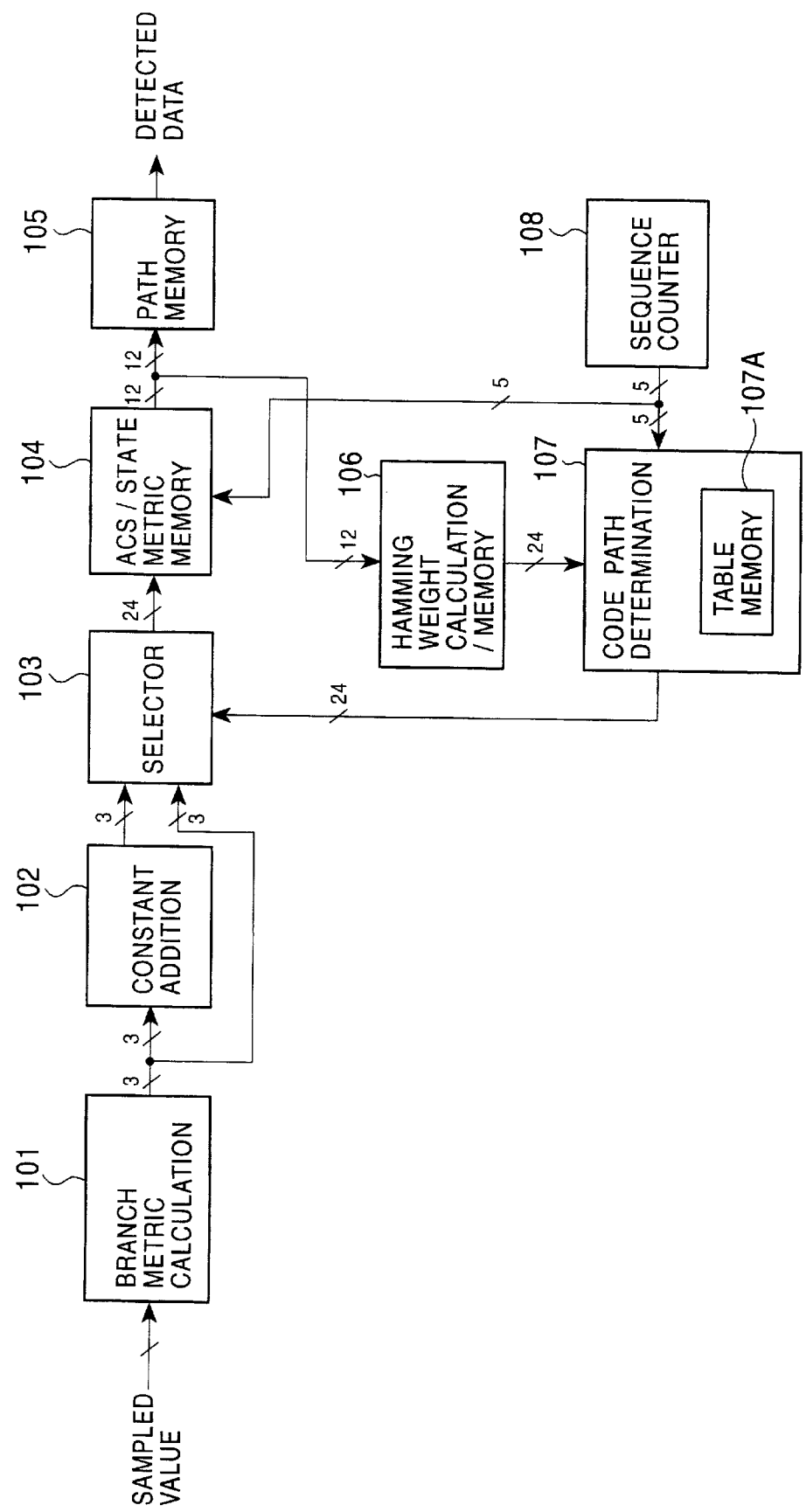

ENCODING METHOD, ENCODING APPARATUS, DECODING METHOD, DECODING APPARATUS, AND RECORDING MEDIUM

BACKGROUND OF THE INVENTION

1. Field of the Invention

The present invention relates to an encoding method, an encoding apparatus, a decoding method, a decoding apparatus, and a recording medium. More particularly, the present invention relates to an encoding method, an encoding apparatus, a decoding method, a decoding apparatus, and a recording medium, which are suitable for recording various types of data such as video data, audio data, and other digital data on a recording medium such as a magnetic disk, magnetic tape, optical disk, magneto-optical disk, and phase-change disk.

2. Description of the Related Art

When video data or audio data is recorded in a digital fashion on a disk such as a magnetic disk or an optical disk, or a magnetic tape so that it can be reproduced later, it is desirable that the data can be recorded with high density. To meet the above requirement, digital data is recorded, in many cases, by means of partial response (1, 0, −1) or partial response (1, 1). The partial response (1, 0,−1) or partial response (1, 1) technique may be combined with the maximum likelihood decoding (detection) technique so as to realize higher-density recording. This mixed technique is referred to as the partial response maximum likelihood (PRML) technique. Maximum likelihood decoding is generally realized using the Viterbi decoding (detection) technique.

In the mixed technique of PRML, if encoding is performed in such a manner as to have a large free squared Euclidean distance (hereinafter also referred to simply as a free distance), the signal-to-noise ratio can be improved and thus it becomes possible to achieve high-density recording. This technique is called the trellis coded partial response (TCPR) scheme. A code generated according to this coding method is one of trellis codes.

The free distance refers to a minimum Euclidean distance between two different paths which emerge from the same state and which end at the same state in a trellis diagram representing an output sequence of a partial-response channel (such a trellis is referred to as a detection trellis, and Viterbi detection may be performed based on a detection trellis). The starting state and the ending state may or may not be identical to each other.

For example, in the partial response (1, 0, −1) scheme (hereinafter referred to simply as the PR4 scheme), when the free distance detected by the conventional bit-by-bit detection technique is 1, a free distance of 2 can be obtained in the Viterbi detection. Since the signal-to-noise ratio increases with the free distance, the recording density increases with the free distance. Furthermore, in conjunction with the PR4 scheme, a practical technique is known to obtain a trellis code having a free distance even greater than 4.

In theory, it is possible to increase the free distance if the power spectrum of a code has a null coincident with the null of the transfer function of a communication line. Trellis codes generated according to this theory are called matched spectral null (MSN) codes.

For example, in the PR4 scheme, the free distance can be increased by generating a code in such a manner that its power spectrum has a null at a DC frequency and also at a frequency (Nyquist frequency) equal to one-half the recording rate (=1/Tc where Tc is the time period (bit period) of each code bit).

On the other hand, in the partial response (1, 1) scheme (hereinafter referred to as the PR1 scheme), a large free distance can be obtained when the power spectrum of a code has a null at the Nyquist frequency.

If +1 and −1 are assigned to code symbols "1" and "0", respectively, and if the sum of assigned values for a code sequence calculated from its start (starting point), then the sum can be used as a measure for indicating the DC component of the power spectrum of the code. This sum is called the RDS (running digital sum) of the code sequence. If the RDS falls within a certain range, the DC component of the power spectrum of the code can be considered to be null.

An alternating digital sum (ADS) can be defined as the value which is obtained by first multiplying −1 with every two elements of a sequence of codes which are assigned alternately +1 and −1 as with the calculation of the RDS, and then calculating the sum of the values of all elements of the resultant sequence. The ADS can be used as a measure for evaluating the Nyquist frequency component. That is, if the ADS falls within a particular range, the power spectrum of the code can be regarded as having a null at its Nyquist frequency.

When the transfer function has a DC component as with the case in a PR1 system, it is generally required that the DC component of power spectrum of the code should be null. For example, in a magnetic recording/reproducing system having a derivative characteristic in its reproducing section, it is required that codes to be recorded include no DC component, because a DC component can cause a fluctuation of the reference level during the operation of detecting codes from a playback signal by means of Viterbi detection, and thus an error can occur due to such a fluctuation. The above requirement should also be met to prevent a fluctuation from occurring in various error signals such as a tracking error signal used in servo control for a disk drive for recording or reproducing data on or from an optical disk or a magneto-optic disk.

To achieve the above requirement, in many modulation/conversion techniques such as the 8/10 conversion coding used in a digital audio tape recorder (DAT), eight-to-fourteen modulation (EFM) used in a compact disk (CD) player, and the Miller square (Miller-2) scheme used in a magnetic disk drive, the digital sum variation (DSV) or the variation in the RDS of an not return to zero (NRZ) code in which modulation occurs as to mark position or of an no return to zero inverted (NRZI) code in which modulation occurs as to mark length is controlled to a low level.

Furthermore, when the PRML technique is employed, the length of a path memory used in Viterbi detection is an important consideration. The path memory is used to store a temporary result during a Viterbi detection process until a final result is obtained. Therefore, the path memory is required to have a length (storage capacity) corresponding to the period of time required to obtain the final detection result (decoding result).

The period of time required to obtain final Viterbi detection result, which determines the required length of the path memory, can be controlled by generating codes such that no quasi-catastrophic sequences occur.

The quasi-catastrophic sequences refer to two or more paths in a trellis diagram, which occur infinitely for a particular code bit sequence. For example, when a code sequence 101010 is given, if transitions such as 111 . . . 333 . . . , and 555 . . . , occur infinitely on a trellis diagram, these three paths are called quasi-catastrophic sequences. Quasi-catastrophic sequences run along parallel paths in a trellis diagram. The squared Euclidean distances among those paths are never accumulated and are maintained at zero. Therefore, it is impossible to determine which sequence of those sequences is correct. In other words, it is impossible to select a correct path. Thus, if quasi-catastrophic sequences occur, it becomes impossible to obtain a unique result in Viterbi detection.

When a practical apparatus for performing Viterbi detection is produced, it is impossible to produce a path memory having an infinite length. On the contrary, it is needed to reduce the length of the path memory as possible so as to meet requirements of low cost and small installation space. For the above reasons, it is required to eliminate quasi-catastrophic sequences for example as follows.

In the case where 8/10 coding is performed using the PRI technique, quasi-catastrophic sequences can be prevented by limiting the number of successive is in a data sequence to be subjected to NRZI process.

In record signals or codes, Tmin (the minimum length of a succession of identical symbols) and Tmax (the maximum length of a succession of identical symbols) are both important measures for evaluating the performance of the codes.

It is desirable that Tmax be as small as possible. For example, in a magnetic recording/reproducing apparatus, great Tmax can cause degradation in erasing ratio during an overwrite operation. On the other hand, in azimuth recording, large Tmax can increase cross talk from an adjacent track, which results in degradation of quality of reproduced data. Furthermore, in a phase locked loop (PLL) operation, large Tmax can cause a loss of information used for synchronization, which causes an error in operation.

An MSN code called partitioned-MSN 8/10-rate code which can have a free distance of 4 when coupled with the PR4 technique has been recently proposed by L. Fredrickson, R. Karabed, J. Rae, P. Siegel, H. Thapar and R. Wood ("Improved Trellis-coding for Partial-Response Channels", IEEE Transactions on Magnetics, Vol. 31, No. 2, March 1995). This technique can generate a code with a path memory length shorter than required in known 8/10-rate MSN codes (for example an MSN code disclosed in U.S. Pat. No. 5,095,484 or such that proposed by H. Thapar, J. Rac, C. Shung, R. Karabed and P. Siegel (On the performance of a Rate 8/10 Matched Spectral Null Code for Class-4 Partial Response", IEEE Transactions on Magnetics, Vol. 28, No. 5, September, 1992).

FIG. 32 illustrates a rule of generating an 8/10-rate partitioned-MSN code.

In FIG. 32, there is shown a trellis representing changes in RDS of a code (partitioned-MSN code) generated in response to transitions of states (hereinafter such a trellis will be referred to as an RDS trellis). In this RDS trellis, whenever a state transition occurs after starting from the start point, a 1-bit code is output (generated), and thus, a 10-bit code is generated when arriving at the end point. Therefore, the 0th bit of the code corresponds to the start point and the 10th bit corresponds to the end point.

In the example shown in FIG. 32, the RDS at the start point of the RDS trellis has a value of 3 or 5.

In the case where the RDS is equal to 3 at the start point, +1 or +3 is added to the RDS during a path to the 5th bit, and thus the RDS becomes 4 or 6. On the other hand, when the RDS is equal to 5 at the start point, −1 or 3 is added to the RDS during a path to the 5th bit, and thus the RDS becomes 4 or 2. In any case, the RDS returns to 3 or 5 at the 10th bit or the end point.

Those points other than the start and end points where the RDS is limited to particular values are referred to as linked points. In the specific example shown in FIG. 32, the RDS at the 5th bit is limited to 2, 4, or 6, and thus the 5th bit is a linked point.

In FIG. 32, when the RDS has a value of 3 at the start point, the RDS is inhibited from having a particular value (2 in this example) at the 5th bit (the linked point), of those values of 2, 4, and 6. In the case where the RDS has a value of 5 at the start point, on the other hand, the RDS is inhibited from having a particular value (6 in this example) at the 5th bit (the linked point), of those values of 2, 4, and 6. In partitioned-MSN coding, as described above, the RDS is inhibited from having a particular value at a linked point depending on what value the RDS has at the start point. This prevents the detection trellis from having parallel paths within a 10-bit length, thus preventing quasi-catastrophic sequences from occurring. As a result, it becomes possible to reduce the length of the path memory.

When partitioned-MSN code are generated using the PR4 technique, two codes may be interleaved in such a manner that the power spectrum of the resultant interleaved code has a null at both DC frequency and Nyquist frequency. Since Tmax associated with uninterleaved 10-bit codes obtained by the process described above with reference to FIG. 32 is equal to 6Tc, Tmax for interleaved codes becomes equal to 12Tc (=2×6Tc).

The partial response characteristic can be represented by a transfer polynomial expression. If a delay operator representing a delay in time Tc (a bit-period delay operator) is denoted by D, then for example PR4 can be represented as $(1-D)2$, and PR1 can be represented as $(1+D)$. The expression $(1-D)2$ can be divided into two expressions each comprising $(1-D)$. Therefore, in PR4, if a code is sampled at time intervals of 2Tc and is divided into two sequences, then each sequence can be represented by $(1-D)$. In the case of PR4, therefore, Viterbi detection is generally performed independently for a sequence of values sampled at times of Tc×2n and for a sequence of values sampled at times of Tc×(2n+1). This process is thus equivalent to the process of separately detecting two uninterleaved codes.

FIG. 33 illustrates an example of a detection trellis corresponding to $(1-D)$. The code generation rule shown in FIG. 32 is directly reflected in this detection trellis. Therefore, the mechanism for preventing quasi-catastrophic sequences from occurring is also realized in this detection trellis. That is, in the section from the start point to a linked point (the 5th bit in this example), the detection trellis is divided into two parts depending on whether the RDS is 3 or 5 in the initial state. This trellis structure prevents quasi-catastrophic sequences from occurring.

FIG. 34 illustrates another example of a detection trellis corresponding to $(1-D)$. In this example, unlike the example shown in FIG. 33, the detection trellis is not divided into a plurality of parts, and the same detection trellis is used regardless of the RDS value at the start point. In this case, when a code is generated, no restriction is imposed on the RDS value regardless of its value at the start point. In other words, there is a possibility that paths. (for example, shaded paths in FIG. 34) which result in quasi-catastrophic sequences are taken in Viterbi detection process. In this case, the generalized truncation depth (GTD), which is a measure of the length required for the pass memory, becomes 20 bits.

Herein, the GTD refers to a maximum path length of all possible pairs of paths which emerge from their common states and which run until the squared Euclidean distance between possible pairs of paths reaches a predetermined value (for example 4 in the case of the partitioned MSN code). Herein, one of each pair of paths is assumed to be generated by a code.

To achieve desired performance, it is required that the length of the path memory should be at least equal to or greater than GTD.

If PR1 and PR4 are compared to each other, the spectrum with PR1 includes lower high-frequency components and thus includes less high-frequency noise. Therefore, PR1 is more suitable for use in high linear density recording. Therefore, it is desirable to apply the above-described trellis code to PR1 to achieve high linear density.

FIG. 35 illustrates the relationship between the error rate and the linear density for PR1 and PR4, reported in a paper titled "8/10 PR1ML for High Density and High Rate Tape Storage Systems" (IEEE Transaction on Magnetics, Vol. 31, No. 6, November, 1995, pp. 3036–3038). In FIG. 35, the horizontal axis represents the linear density in Kbpi, which indicates how many bits are recorded per inch in a linear direction, wherein a greater value indicates a higher linear density. As can be seen from FIG. 35, PR1 (8/10 PR1ML) provides a better (lower) error rate than PR4 (8/9 PR4ML) in the high linear density range.

The inventors of the present invention have proposed a technique of generating a 16/20 trellis code with a high conversion efficiency (coding efficiency) for PR1 in Japanese Patent Publication No. 8-64143. This technique can provide a coding efficiency of 4/5 which is the same as that obtained by the 8/10 coding technique. Therefore, the power spectrum of 16/20 codes has a null at the Nyquist frequency and it includes no DC component. Therefore, the desirable DSV control can be achieved and the free distance can be equal to 4. The GTD is 5 times the code length (=100 bits=5×20 bits), and Tmax=10Tc.

In the 16/20 codes, since the GTD is equal to 100 bits, the required length of the path memory is also of the order of 100 bits. However, it is desirable to further reduce the length of the path memory so as to reduce the hardware size and production cost. In this technique proposed by the inventors of the present invention, since data with a rather long length such as 16 bits is encoded into 20-bit data, and 20-bit data is decoded into 16-bit data, large-sized encoding and decoding apparatus are required.

That is, to perform encoding/decoding between m-bit and n-bit data, the memory in the encoder should have a capacity greater than 2 m×n bits and the memory in the decoder should have a capacity greater than 2 n×m bits. This means that if m and n are reduced, the memory capacity required by the encoder/decoder decreases exponentially. This allows a great reduction in the hardware size. For the above reason, it is desirable that the unit length m of data to be converted to codes and the unit length n of codes should be as small as possible.

A sequence of interleaved partitioned-MSN codes generated according to the scheme shown in FIG. 32 may be applied not only to PR4 but also to PR1, because the power spectrum of the sequence of interleaved codes has a null at the Nyquist frequency and includes no DC component, and because no quasi-catastrophic sequences occur when it is applied to PR1. Since the power spectrum includes no DC component, the above-described problems caused by the DC component do not occur. Furthermore, since the Nyquist-frequency component of the power spectrum is null, it is possible to achieve a free distance of 4 for PR1. When a partitioned-MSN code is used with PR1, the GTD becomes 40 bits which is fairly smaller than the GTD of 100 bits associated with the 16/20 codes described above.

However, when the partitioned MSN code is applied to PR1 in such a manner as shown in FIG. 32, if a detection trellis which is divided into sub-trellises according to the initial state as shown in FIG. 33 is employed in the decoding operation, the detection trellis corresponding to interleaved codes can include invalid state transitions which cannot be generated by any code as will be described in detail later. Therefore, it is impossible to eliminate all quasi-catastrophic sequences.

If a detection trellis is divided into a plurality of parts as in FIG. 33, the total number of states becomes greater than that of the original detection trellis. In both detection trellises shown in FIGS. 33 and 34 (and also in the RDS trellis shown in FIG. 32, and in those RDS trellises, detection trellises and ADS trellises which will be described later), the vertical axis represents possible states which change along the horizontal axis. In the case of the undivided detection trellis shown in FIG. 34, the maximum possible number of states is 6 which occurs at 2nd to 9th bits. In contrast, in the divided detection trellis shown in FIG. 33, the maximum number of states is 10 which occurs at the 3rd and 4th bits. Taking into account the fact that the hardware size of a Viterbi detector increases with the number of states, it is desirable to employ an undivided detection trellis.

When two partitioned-MSN codes described above with reference to FIG. 32 are interleaved into a single code, Tmax associated with the resultant interleaved code becomes 12Tc as described above. However, Tmax associated with 8/10 codes used in DATs or DDSs is equal to 4Tc, which is fairly smaller than the above value. As described earlier, it is desirable that Tmax should be as small as possible.

In addition to the partitioned MSN code described above with reference to FIG. 32, some techniques of generating similar 8/10-rate MSN codes are known. The power spectrum of these codes includes no DC component and has a null at the Nyquist frequency. If only this fact is considered, these codes seem capable of being applied to PR1. In reality, however, these MSN codes employ different techniques to reduce the length of the path memory, and thus these MSN codes are difficult to be applied to PR1.

In view of the above, it is an object of the present invention to provide a technique of generating a partitioned-MSN code which is small in Tmax and which can be applied not only to PR1 but also to partial response represented by a transfer polynomial of $(1+D)n$. It is another object of the present invention to provide a technique of effectively removing quasi-catastrophic sequences without dividing a detection trellis thereby reducing the number of states in the detection trellis whereby the length of a path memory is reduced, thus achieving a Viterbi detector with a reduced size. It is a further object of the present invention to provide a technique of constructing a small-sized encoder/decoder for encoding/decoding a partitioned MSN code.

SUMMARY OF THE INVENTION

The invention provides an encoding method, an encoding apparatus, a decoding method, a decoding apparatus, and a recording medium, in which a 10-bit code is obtained using an RDS trellis characterized in that: when maximum and minimum values of the running digital sum (RDS) of a 10-bit code are denoted by maximum RDS value and minimum RDS value, respectively, the difference between the maximum and minimum RDS values in the RDS trellis representing the change in the RDS associated with the 10-bit code is set to 6; the RDS at the start point is set to a value equal to the minimum RDS value +2 or equal to the maximum RDS value −2; when the RDS at the start point is equal to the minimum RDS value +2, the RDS at the 9th bit counted from the start point is inhibited from having a value equal to the minimum RDS value +1; when the RDS at the start point is equal to the maximum RDS value −2, the RDS at the 9th bit counted from the start point is inhibited from having a value equal to the maximum RDS value −1; and the RDS at the end point of the RDS trellis is set to a value equal to the minimum RDS value +2 or equal to the maximum RDS value −2.

Preferably, in the decoding method, an invalid state transition in the detection trellis, which cannot be generated by a partitioned MSN (partitioned-matched spectral null) code, is detected on the basis of the number of 1s or 0s included in the partitioned MSN code, the invalid state transition is removed from the detection trellis, and Viterbi decoding is performed according to the resultant detection trellis.

The decoding apparatus preferably comprises: path metric calculation means for calculating a plurality of path metrics using a branch metric; selection means for selecting a desired path metric from the plurality of path metrics; detection means for detecting an invalid state transition in the detection trellis, which cannot be generated by a partitioned MSN (partitioned-matched spectral null) code, on the basis of the number of 1s or 0s included in the partitioned MSN code; and conversion means for modifying the branch metric corresponding to the invalid state transition in such a manner as to decrease the likelihood degree with respect to the invalid state transition.

The decoding apparatus preferably comprises: path metric calculation means for calculating a plurality of path metrics using a branch metric; selection means for selecting a desired path metric from the plurality of path metrics; detection means for detecting an invalid state transition in said detection trellis, which cannot be generated by a partitioned MSN (partitioned-matched spectral null) code, on the basis of the number of 1s or 0s included in the partitioned MSN code; and control means for controlling the selection means so that the path metric corresponding to a path including the invalid state transition is not selected.

The encoding method, the encoding apparatus, the decoding method, the decoding apparatus, and the recording medium are characterized in that a 10-bit code is obtained using an RDS trellis in which: when maximum and minimum values of the RDS (running digital sum) of the 10-bit code are denoted by maximum RDS value and minimum RDS value, respectively, the difference between the maximum and minimum RDS values in the RDS trellis representing the change in the RDS associated with the 10-bit code is set to 6; the RDS at the start point is set to a value equal to the minimum RDS value +2 or equal to the maximum RDS value −2; when the RDS at the start point is equal to the minimum RDS value +2, the RDS at the 9th bit counted from the start point is inhibited from having a value equal to the minimum RDS value +1; when the RDS at the start point is equal to the maximum RDS value −2, the RDS at the 9th bit counted from the start point is inhibited from having a value equal to the maximum RDS value −1; and the RDS at the end point of the RDS trellis is set to a value equal to the minimum RDS value +2 or equal to the maximum RDS value −2.

In the preferred mode of the decoding method, as described above, an invalid state transition in the detection trellis, which cannot be generated by the partitioned MSN (partitioned-matched spectral null) code, is detected on the basis of the number of 1s or 0s included in the partitioned MSN code, the invalid state transition is removed from the detection trellis, and Viterbi decoding is performed according to the resultant detection trellis.

In the preferred mode of the decoding apparatus, as described above, the path metric calculation means calculates a plurality of path metrics using a branch metric; the selection means selects a desired path metric from the plurality of path metrics; the detection means detects an invalid state transition in the detection trellis, which cannot be generated by a partitioned MSN (partitioned-matched spectral null) code, on the basis of the number of 1s or 0s included in the partitioned MSN code; and the conversion means modifies the branch metric corresponding to the invalid state transition in such a manner as to decrease the likelihood degree with respect to the invalid state transition.

In the preferred mode of the decoding apparatus, as described above, the path metric calculation means calculates a plurality of path metrics using a branch metric; the selection means selects a desired path metric from the plurality of path metrics; the detection means detects an invalid state transition in the detection trellis, which cannot be generated by a partitioned MSN (partitioned-matched spectral null) code, on the basis of the number of 1s or 0s included in the partitioned MSN code; and the control means controls the selection means so that the path metric corresponding to a path including the invalid state transition is not selected.

BRIEF DESCRIPTION OF THE DRAWINGS

FIG. 8 illustrates a conversion table.

FIG. 9 illustrates a conversion table.

FIG. 10 illustrates a conversion table.

FIG. 11 illustrates a conversion table.

FIG. 12 illustrates a conversion table.

FIG. 13 illustrates a conversion table.

FIG. 14 illustrates a conversion table.

FIG. 15 illustrates a conversion table,

FIG. 26 illustrates a decision table.

FIG. 27 illustrates a decision table.

FIG. 28 illustrates a decision table.

FIG. 29 illustrates a decision table.

FIG. 30 is a block diagram illustrating an example of the construction of the Viterbi detector shown in FIG. 1.

DESCRIPTION OF THE PREFERRED EMBODIMENTS

Figure 1:
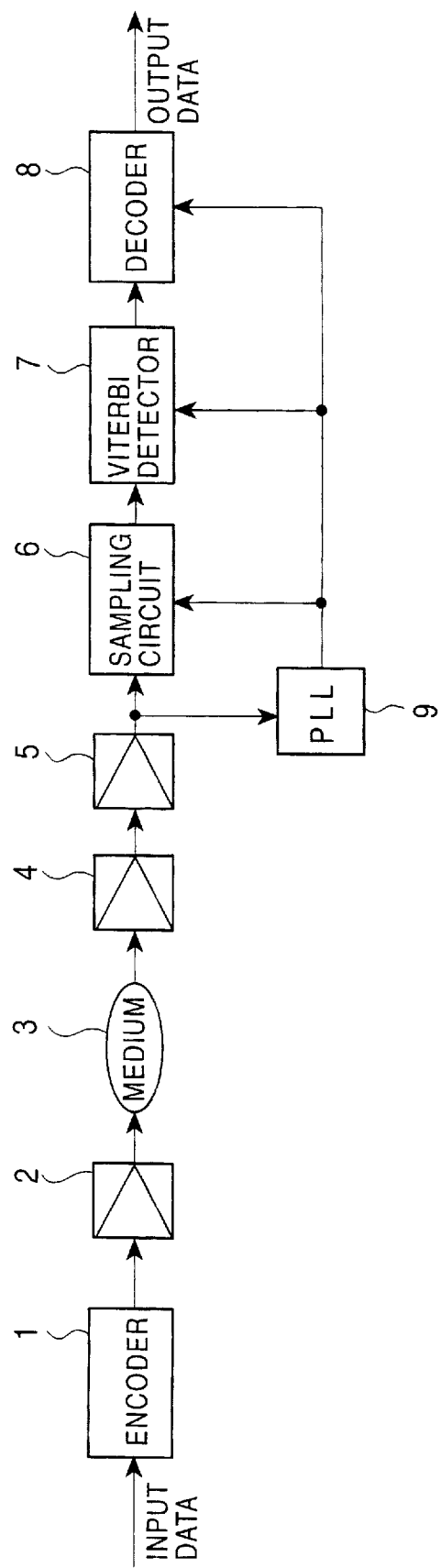
FIG. 1 is a block diagram illustrating an embodiment of a recording/reproducing apparatus according to the present invention.

FIG. 1 illustrates an embodiment of a recording/reproducing apparatus according to the present invention.

In this embodiment, PR1 is employed. However the present invention is not limited to that, and the invention may also be applied to any partial response represented by a transfer polynomial in the form of (1+D)n (where n is an integer equal to or greater than 1), because transfer functions (frequency characteristics) in the form of (1+D)n has a null at the Nyquist frequency which is the same as that of PR1. PR1 can be regarded as a specific case of (1+D)n in which n=1.

Figure 2:
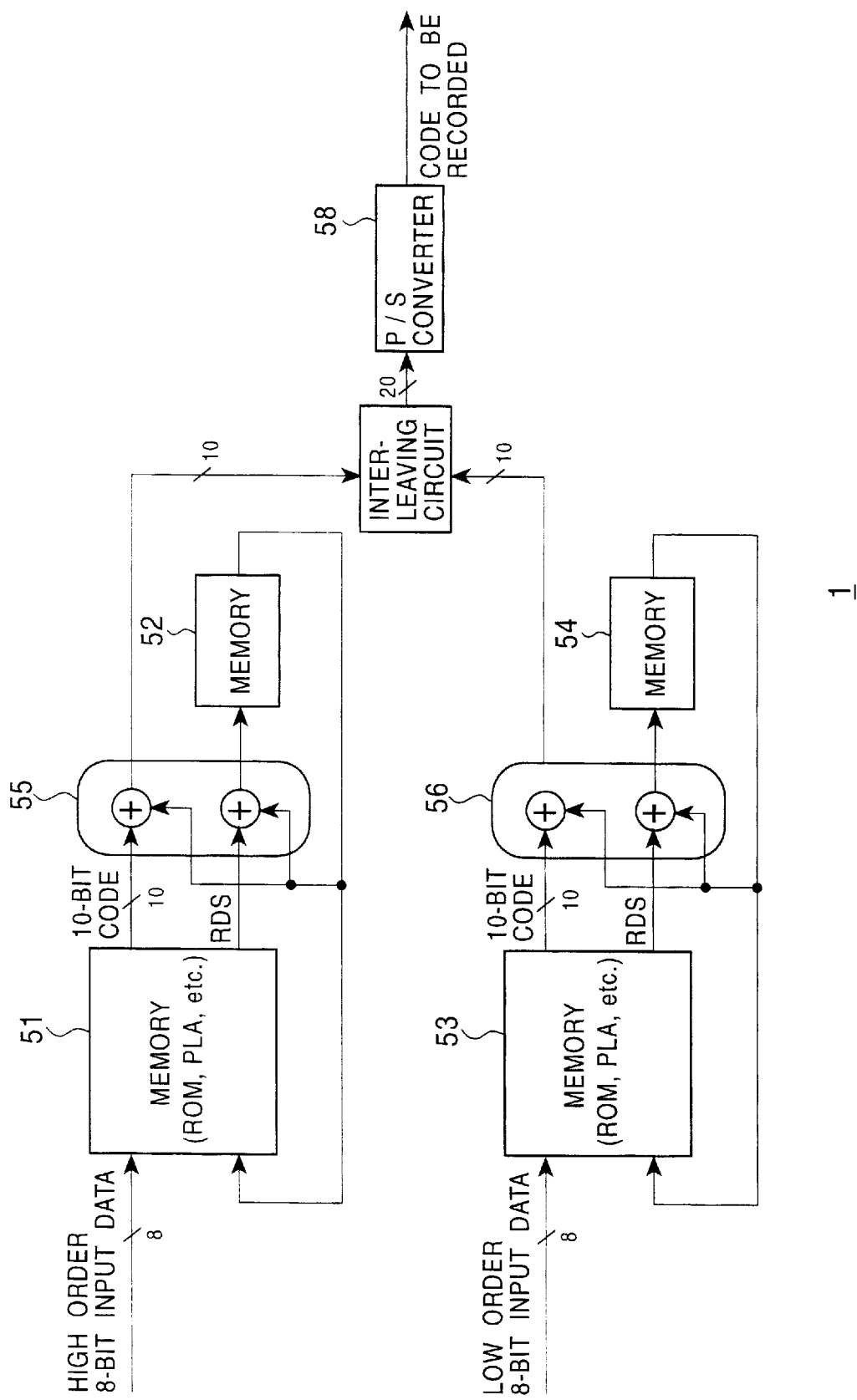
FIG. 2 is a block diagram illustrating an example of the construction of the encoder shown in FIG. 1.

The recording/reproducing apparatus includes an encoder 1 which comprises, as shown in FIG. 2, memories 51 and 53 each comprising a ROM (read only memory) or a PLA (programmable logic array); memories 52 and 54 each comprising a register or the like; mod-2 adders 55 and 56 which invert the outputs of the memories 51 and 53, respectively, depending on the outputs of the memories 52 and 54; an interleaving circuit 57 for alternately placing the outputs of the memories 51 and 53 bit by bit and outputting the result; and a parallel-serial converter 58 for converting parallel data output from the interleaving circuit 57 to serial data.

The encoder 1 receives a sequence of information such as video data, audio data, or the like, for example in a 16-bit data form, which is to be recorded on a medium 3 such as an optical disk, magneto-optical disk, magnetic disk, magnetic tape, or phase-change disk. The encoder 1 converts (encodes) the received 16-bit digital data to a 20-bit code, and outputs the resultant data to a recording amplifier 2. The recording amplifier 2 amplifies the signal in the form of code data received from the encoder 1, and records the amplified signal on the medium 3.

A playback amplifier 4 amplifies a playback signal detected from the medium 3, and supplies the resultant signal to an equalizer amplifier 5. The equalizer amplifiers 5 performs waveform equalization on the playback signal supplied from the playback amplifier 4 and supplies the equalized signal to a sampling circuit and a PLL circuit 9. The sampling circuit 6 samples the playback signal received from the equalizer amplifier 5 in response to a clock signal from the PLL circuit 9, and supplies the resultant sampled value to a Viterbi detector 7. The Viterbi detector 7 detects (by means of Viterbi decoding) a sequence of codes from the sampled values supplied from the sampling circuit 6, and supplies the detected result (Viterbi decoding result) to a decoder 8.

Figure 3:
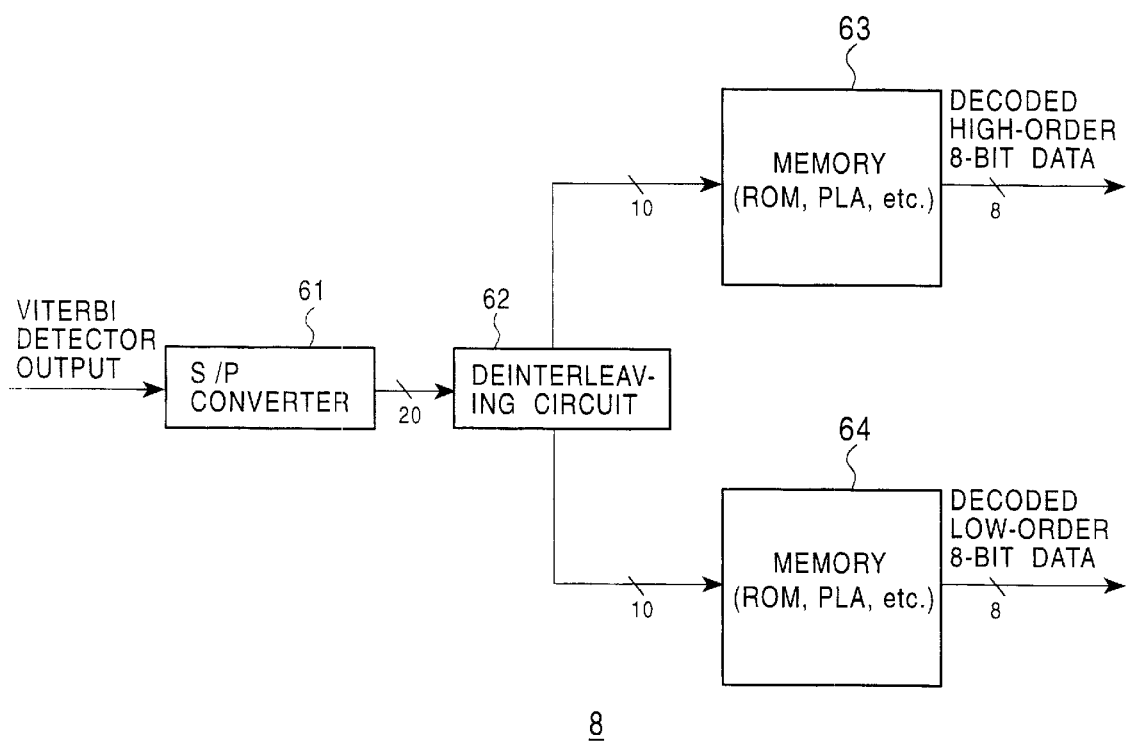
FIG. 3 is a block diagram illustrating an example of the construction of the decoder shown in FIG. 1.

Referring to FIG. 3, the decoder 8 comprises, for example, a serial-parallel converter 61; a deinterleaving circuit 62 for converting (deinterleaving) the code interleaved by the encoder 1 to two sequences of codes in the original forms; and memories 63 and 64 in the form of a ROM or PLA. The decoder 8 decodes the 20-bit code into digital data in the original 16-bit form.

The PLL circuit 9 generates a clock signal from the playback signal received from the equalizer amplifier 5, and supplies the clock signal to the sampling circuit 6, the Viterbi detector 7, and the decoder 8. In response to the clock signal, the sampling circuit 6, the Viterbi detector 7, and the decoder 8 perform their own operations.

In this specific embodiment, there is no precoder in the recording section of the apparatus.

The operation of the recording/reproducing apparatus is described below.

The 16-bit data input to the encoder 1 is divided for example into high-order 8-bit data and low-order 8-bit data, which are input to the memory 51 and the memory 53, respectively (FIG. 2). The memories 51 and 53 store conversion tables which will be described later. When the memories 51 and 53 receive the high-order 8-bit data and the low-order 8-bit data, respectively, the memories 51 and 53 read 10-bit codes from the conversion tables at the addresses of the received 8-bit data. In other words, the memories 51 and 53 each convert (encode) the 8-bit data to 10-bit codes.

The conversion tables include 8-bit data and 10-bit codes related to each other. The 10-bit codes are generated according to the following generation rule.

Figure 4:
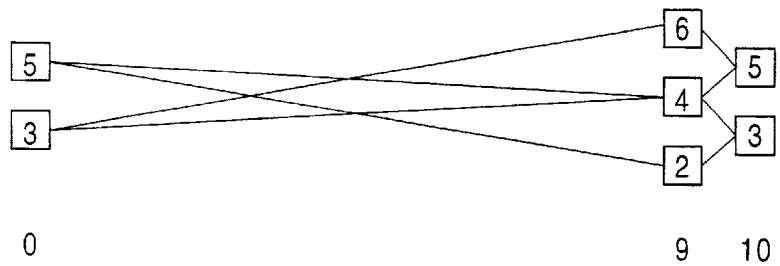
FIG. 4 is a diagram illustrating the rule of generating a 10-bit code by the encoder shown in FIG. 1.

FIG. 4 illustrates the rule of generating 10-bit codes represented in the form of an RDS trellis stored in the conversion tables.

In FIG. 4, there are shown transitions (changes) in the RDS, which can occur at the starting bit, the 9th bit, and the ending bit of a 10-bit code. The 9th bit serves as a linked point. In the case where the RDS is equal to 3 at the start point, the RDS becomes 4 or 6 at the 9th bit, and 3 or 5 at the end point. On the other hand, if the RDS is equal to 5 at the start point, the RDS becomes 2 or 4 at the 9th bit, and 3 or 5 at the end point. That is, in the present embodiment, the value of the RDS at the 9th bit is limited to 2, 4, or 6. Furthermore, if the RDS has a value of 3 or 5 at the start point, then the RDS is inhibited from taking a value of 2 (when the starting value is 3) or 6 (when the starting value is 5) at the 9th bit.

By limiting the RDS at the linked point (the 9th bit in this case) to particular values, quasi-catastrophic sequences running in parallel on the trellis diagram are prevented from occurring.

In the RDS trellis shown in FIG. 4, the value at the end point of a previous 10-bit code is employed as a starting value to generate a next 10-bit code. This makes it possible to generate a code sequence having a RDS limited to a predetermined particular range.

Figure 5A:
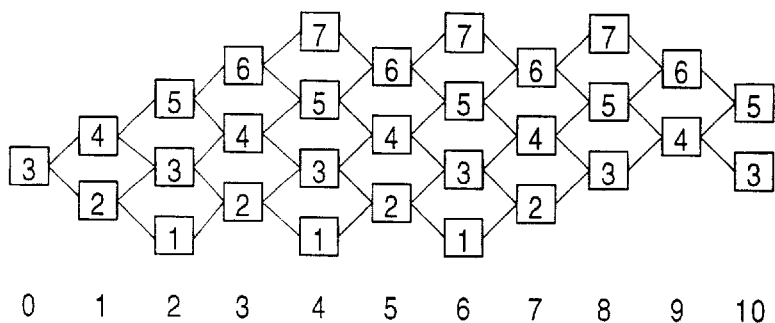
FIG. 5 is a diagram illustrating an RDS trellis.
Figure 5B:
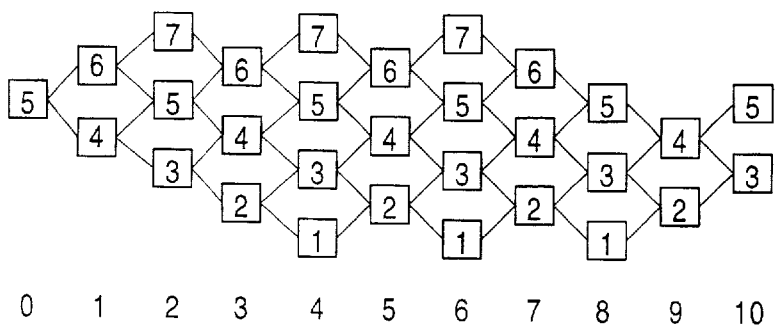

FIG. 5 is an RDS trellis diagram illustrating the code generation rule not only for transitions in the RDS at limited bits (the start point, end point, linked point) shown in FIG. 4, but for all bits, wherein the trellis shown in FIG. 5A illustrates transitions for the case where the RDS at the start point is 3 and that shown in FIG. 5B illustrates transitions for the case where the RDS at the start point is 5.

In the examples shown in FIGS. 5A and 5B, the minimum and maximum RDS values are 1 and 7, respectively.

In total, 306 different 10-bit codes can be generated according to the RDS trellis diagram shown in FIGS. 5A and 5B. This number is sufficiently great to convert 8-bit data to 10-bit codes.

In the example in FIGS. 5A and 5B, the difference between the maximum and minimum RDS values is equal to 6 for the following reason. If the difference between the maximum and minimum RDS values is set to a value less than 6 by either increasing the minimum RDS value from 1 to a greater value or decreasing the maximum RDS value from 7 to a smaller value, then the total number of 10-bit codes which can be generated becomes less than 256, and thus it becomes impossible to uniquely assign a 10-bit code to each of all possible 8-bit data.

In the RDS trellis shown in FIGS. 5A and 5B, the length of a succession of bits having the same value becomes greatest when the RDS increases by 1 each time a state transition occurs from the minimum RDS value to the maximum RDS value or when the RDS decreases by 1 each time a state transition occurs from the maximum RDS value to the minimum RDS value. Therefore, the same value can appear at 6 successive bits at most. This means that Tmax of 10-bit codes generated according to the RDS trellis shown in FIG. 5 is equal to 6Tc.

In FIGS. 5A and 5B, there are 6 patterns in which the same value appears at 6 successive bits. A first such pattern appears in a path in which the RDS at the 2nd bit equals 1 in FIG. 5A and the RDS increases by 1 at each transition until it reaches 7 at the 8th bit. A second such pattern appears in a path in which the RDS at the 2nd bit is equal to 7 in FIG. 5B and the RDS decreases by 1 at each transition until it reaches 1 at the 8th bit.

A third pattern appears in a path in which the RDS at the 6th bit is equal to 1 in FIG. 5A and the RDS increases by 1 at each transition until it reaches 7 at the 2nd bit in FIG. 5B. A fourth pattern appears in a path in which the RDS at the 6th bit is equal to 7 in FIG. 5B and the RDS decreases by 1 at each transition until it reaches 1 at the 2nd bit in FIG. 5A. A fifth pattern appears in a path in which the RDS at the 8th bit is equal to 1 in FIG. 5B and the RDS increases by 1 at each transition until it reaches 7 at the 4th bit in FIG. 5A. A sixth pattern appears in a path in which the RDS at the 8th bit is equal to 7 in FIG. 5A and the RDS decreases by 1 at each transition until it reaches 1 at the 4th bit in FIG. 5B.

If these six patterns are removed, then the maximum length of a succession of bits having equal bits in any possible 10-bit code can be decreased to 5. That is, Tmax becomes 5Tc.

Such removal can be accomplished if the RDS value is inhibited from taking a value of 1 at the 2nd bit and inhibited from taking a value of 7 at the 4th bit whenever the RDS has a value of 3 at the start point in FIGS. 5A and 5B (such a starting value occurs in FIG. 5A), and if the RDS value is inhibited from taking a value of 7 at the 2nd bit and inhibited from taking a value of 1 at the 4th bit whenever the RDS has a value of 5 at the start point (such a starting value occurs in FIG. 5B).

Figure 6A:
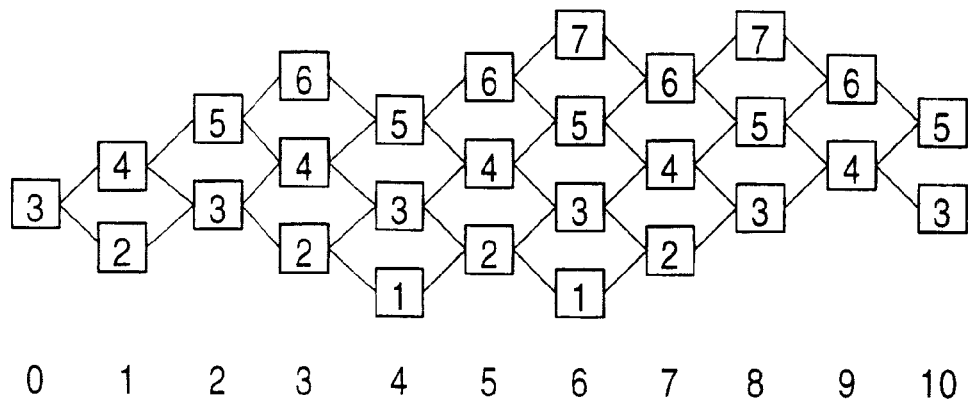
FIG. 6 is a diagram illustrating an RDS trellis.
Figure 6B:
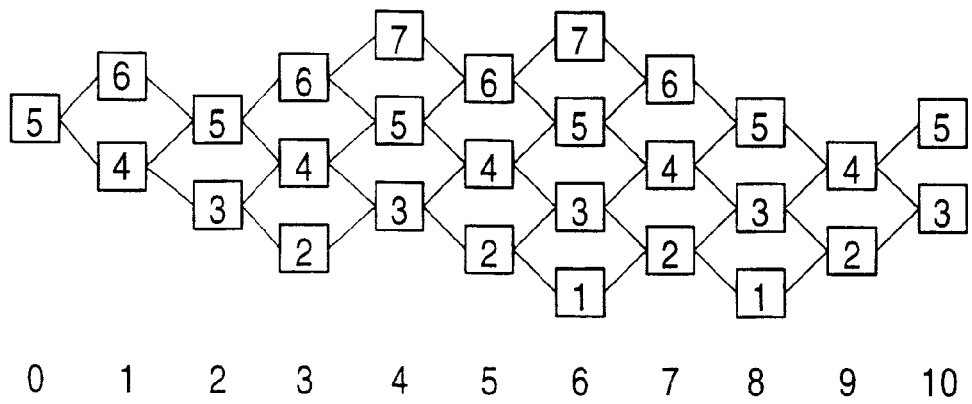

Thus, the RDS trellis shown in FIGS. 5A and 5B becomes such as that shown in FIGS. 6A and 6B in which the six patterns described above no longer occur. As a result, the maximum length of a succession of bits having equal values in 10-bit codes generated according to the RDS trellis shown in FIGS. 6A and 6B becomes 5, and thus Tmax becomes 5Tc.

According to the RDS trellis shown in FIGS. 6A and 6B, it is possible to generate 259 different 10-bit codes. In other words, it is possible to uniquely assign a 10-bit code to each of 256 8-bit data.

Figure 7A:
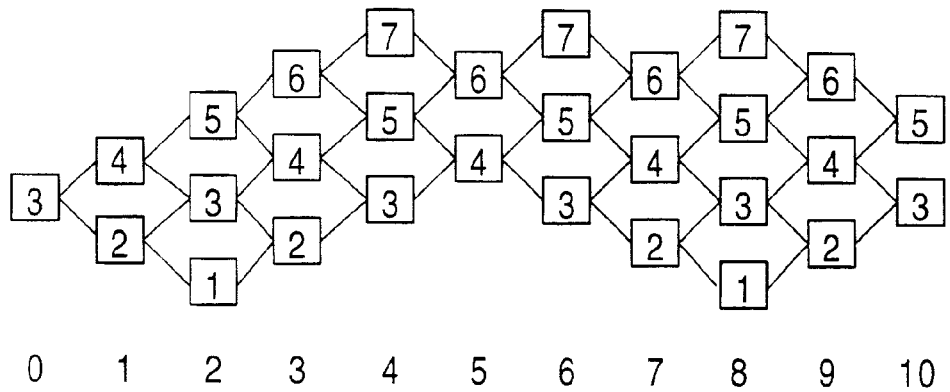
FIG. 7 is a diagram illustrating an RDS trellis.
Figure 7B:
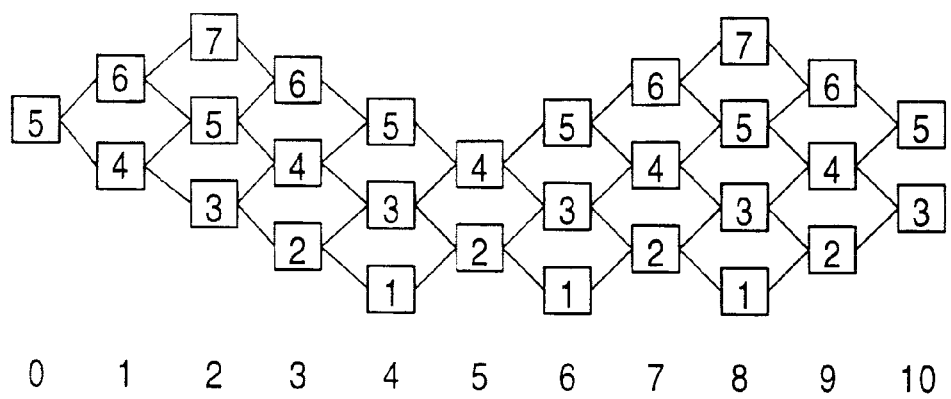
Figure 32:
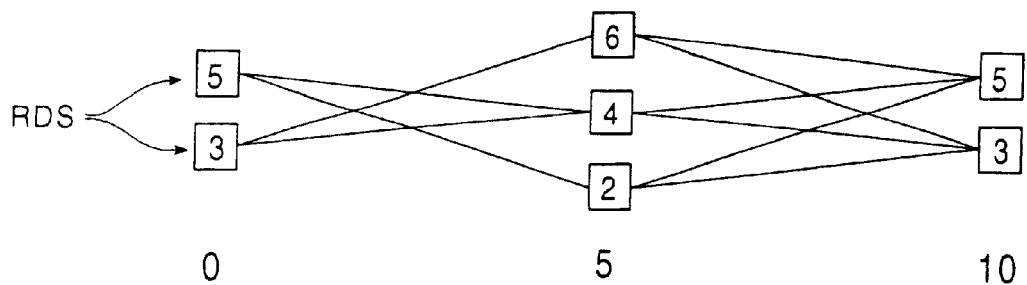
FIG. 32 is a diagram illustrating a rule of generating a code according to a conventional technique.
Figure 33:
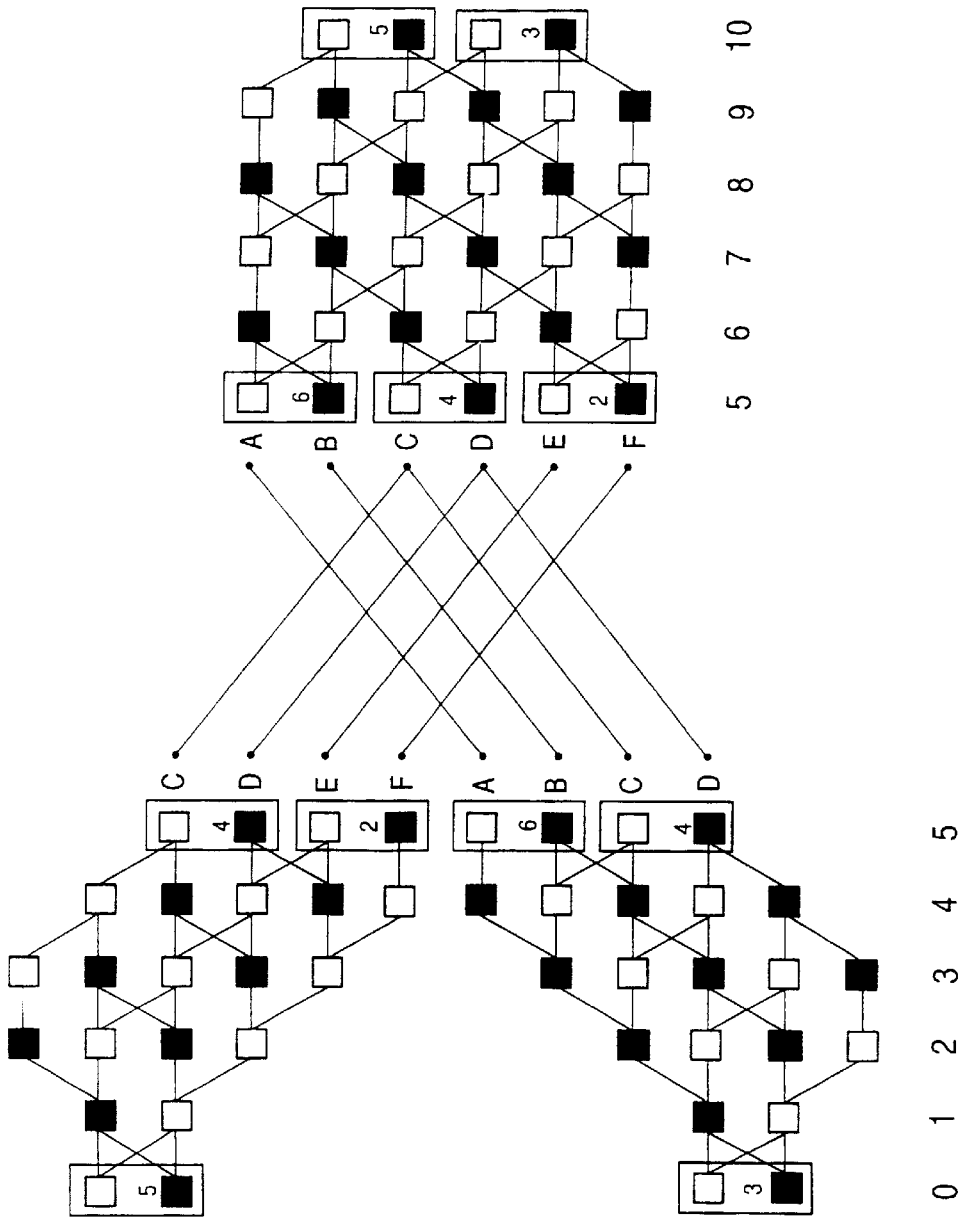
FIG. 33 is a detection trellis in a divided form.

FIGS. 7A and 7B are full illustrations of the RDS trellis shown in FIG. 32, which has a linked point at the 5th bit, wherein the RDS trellis is divided into two parts shown in FIGS. 7A and 7B, respectively, according to the starting RDS value (the starting value is 3 in FIG. 7A and 5 in FIG. 7B).

According to the RDS trellis shown in FIGS. 7A and 7B, it is possible to generate 270 different 10-bit codes. In this case, Tmax is equal to 6Tc. In this RDS trellis, as in the RDS trellis shown in FIGS. 5A and 5B, if the RDS is inhibited from having a value of 1 at the 2nd bit and inhibited from having a value of 7 at the 4th bit when the RDS has a value of 3 at the start point (FIG. 7A), and if the RDS is inhibited from having a value of 7 at the 2nd bit and inhibited from having a value of 1 at the 4th bit when the RDS has a value of 5 at the start point (FIG. 5), then Tmax can be decreased to 5Tc.

However, the resultant RDS trellis can generate only 236 different 10-bit codes. In other words, it is impossible to assign a unique 10-bit code to each of all possible 8-bit data. Therefore, when the code generation rule of the RDS trellis with the linked point at the 5th bit, shown in FIG. 32, is employed, it is impossible to decrease Tmax associated with 8/10-rate codes to 5Tc.

On the other hand, if the code generation rule shown in FIG. 4 in which there is a linked point at the 9th bit, it is possible to generate 10-bit codes with Tmax equal to 5Tc, which can be used to accomplish unique assignment for each of all possible 8-bit data.

FIGS. 8 to 15 illustrate examples of conversion tables used to assign 10-bit codes to 8-bit data according to the RDS trellis shown in FIGS. 6A and 6B, wherein FIGS. 8 to 11 illustrate conversion tables in which the RDS has a value of 3 at the start point, and the RDS has a value of 5 at the start point in the conversion tables shown in FIGS. 12 to 15. In FIGS. 8 to 15, the first column on the left end represents 8-bit data in decimal, the second column represents 10-bit codes in binary, and the third column represents RDS values in decimal at the end point.

In the present embodiment, one of two 10-bit codes each bit of which has an inverted value (1 is inverted to 0, and 0 is inverted to 1 between two 10-bit codes) is assigned to the same 8-bit data depending on whether the RDS has a value of 3 or 5 at the start point. By assigning one of two 10-bit codes having inverted bits to the same 8-bit data, it becomes possible to correctly convert (decode) any 10-bit code to original 8-bit data regardless of whether the 10-bit code is of the inverted form or not.

The memories 51 and 53 shown in FIG. 2 store for example the conversion tables shown in FIGS. 8–11 and 12–15, respectively.

Since 256 10-bit codes are enough in the present embodiment, those 10-bit codes corresponding to 8-bit data having a value in the range from 256 to 258 in decimal in FIGS. 11 to 15 are not included in the conversion tables. Furthermore, in the present embodiment, the RDS can take one of two values, that is either 3 or 5, as represented in the right column of the conversion tables, the RDS value of 3 at the end point may be represented for example by 0, and the RDS value of 5 by 1, in the conversion tables.

Furthermore, since codes are inverted at each bit, as described above, between those having a value of 3 in the RDS and those having value of 5 in the RDS, it is enough for the purpose of the present embodiment if either the conversion tables shown in FIGS. 8 to 11 or those shown in FIGS. 12 to 15 are stored in the memories 51 and 53.

Thus, the memories 51 and 53 store conversion tables including only those 10-bit codes corresponding to the RDS value of 3 (shown in FIGS. 8 to 11). The memory 51 receives not only high-order 8-bit data to be encoded but also an end-point RDS value associated with the previous code stored in the memory 52 so that the memory can output a 10-bit code corresponding to the input 8-bit data and having a start-point RDS value equal to the end-point RDS value associated with the previous code. The memory 51 also outputs an end-point RDS value associated with the 10-bit code output.

The 10-bit code and the end-point RDS value output from the memory 51 are supplied to the mod-2 adder 55. The mod-2 adder 55 also receives the end-point RDS value associated with the previous code from the memory 52. The mod-2 adder 55 outputs either a code which is the same as the 10-bit code received from the memory 51 or a code which is obtained by inverting each bit of the 10-bit code received from the memory 51, wherein which code is output is determined depending on the end-point RDS value associated with the previous code. The 10-bit code output from the mod-2 adder 55 is supplied to the interleaving circuit 57, while the end-point RDS value is supplied to the memory 52 and is stored therein.

The memories 53 and 54 and the mod-2 adder 56, corresponding to the memories 51 and 52 and the mod-2 adder 55, perform similar processes on the low-order 8-bit data and thus a 10-bit code corresponding to the low-order 8-bit data is supplied to the interleaving circuit 57.

The interleaving circuit 57 outputs a 20-bit code in which the 10-bit code corresponding to the high-order 8 bit data and the 10-bit code corresponding to the low-order 8-bit data are placed in an interleaved fashion. If the 10-bit code corresponding to the high-order 8-bit data is denoted by (a0, a1, a2, a3, a4, a5, a6, a7, a8, a9) and the 10-bit code corresponding to the low-order 8-bit data is denoted by (b0, b1, b2, b3, b4, b5, b6, b7, b8, b9) in which symbols corresponding to lower-order bits to higher-order bits are arranged from left to right, the interleaving circuit 57 outputs a 20-bit code represented as (a0, b0, a1, b1, a2, b2, a3, b3, a4, b4, a5, b5, a6, b6, a7, b7, a8, b8, a9, b9) in which bits of the two 10-bit codes corresponding to the low- and high-order 8-bit data are alternately placed. Each 10-bit code has Tmax equal to 5Tc before they are interleaved as described earlier, and thus Tmax for the interleaved 20-bit code becomes 10Tc (=5Tc+5Tc). Tmax obtained herein is small compared to that obtained when the conventional partitioned-MSN codes are applied to PR4. This makes it possible to improve the erasing ratio in overwrite operation. Furthermore it also becomes possible to reduce cross talk between adjacent tracks thereby improving the quality of reproduced data. Still furthermore, it also becomes possible to prevent the PLL circuit from operating in an incorrect fashion.

The minimum and maximum RDS values associated with each of the two uninterleaved 10-bit codes are 1 and 7, respectively, and therefore the minimum and maximum RDS values for the interleaved 20-bit code become 2 (=1+1) and 14 (=7+7), respectively.

Before two 10-bit codes are interleaved, as described earlier, the start-point RDS value of each current 10-bit code is equal to the end-point RDS value associated with the corresponding previous code. Therefore, the start-point RDS value associated with the current interleaved 20-bit code is equal to the end-point RDS value associated with the previous 20-bit code.

As a result, the RDS value of a sequence of interleaved 20-bit codes falls within a certain range and no DC component appears.

The ADS of the sequence of interleaved 20-bit codes also falls within a certain range. Therefore, the Nyquist frequency component of its power spectrum is null, and thus it is possible to achieve a high free distance when applied to PR1 thereby improving resistance to noise.

According to the above-described definition of the ADS, the ADS of an interleaved 20-bit code sequence can be determined by adding the RDS value associated with either one of two uninterleaved 10-bit codes and the RDS value associated with a code which is obtained by inverting all bits of the other one of the two uninterleaved 10-bit codes. Because the RDS associated with any uninterleaved 10-bit code is within a certain range and thus the RDS associated with the code obtained by inverting all bits of any 10-bit code is also within a certain range, the ADS of the interleaved 20-bit code sequence also falls within a certain range. As a result, the Nyquist frequency component of power spectrum of the interleaved 20-bit code sequence becomes null.

The 20-bit code is output in the form of parallel data from the interleaving circuit 57, and supplied to the parallel-serial (P/S) converter 58. The parallel-serial converter 58 converts the received 20-bit code in the form of parallel data into data in a serial form.

The obtained 20-bit code in the form of serial data is then supplied to the medium 3 via the recording amplifier 2 and is recorded on the medium 3.

When data is reproduced from the medium 3, the obtained playback signal is amplified by the playback amplifier 4 and equalized by the equalizer amplifier 5. The resultant signal is then supplied to the sampling circuit 6 and the PLL circuit 9.

The PLL circuit 9 generates a clock signal from the received playback signal, and supplies the resultant clock signal to the sampling circuit 6, the Viterbi detector 7, and the decoder 8.

The sampling circuit 6 samples the playback signal including noise from the equalizer amplifier 5, in synchronization with the clock signal supplied from the PLL circuit 9. The resultant sampled value is supplied to the Viterbi detector 7. The Viterbi detector 7 detects the original bilevel code (0, 1) from the input signal.

Figure 16:
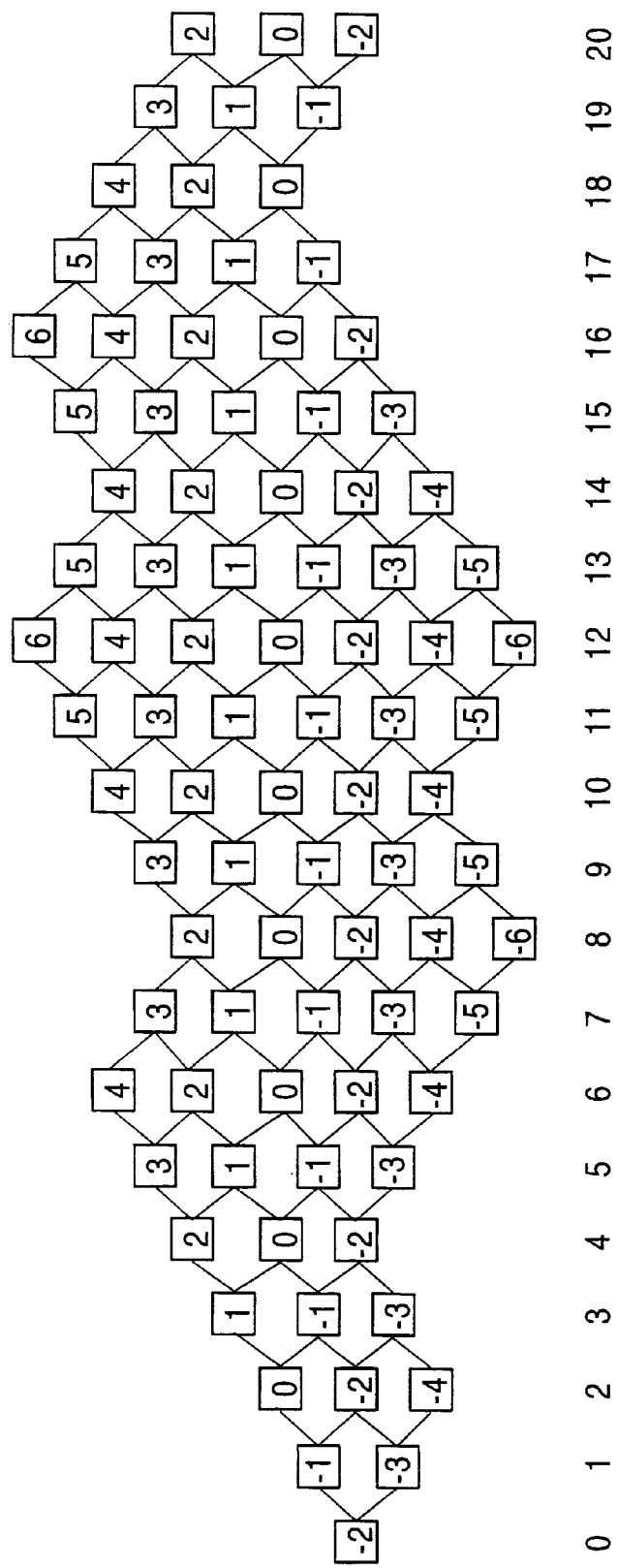
FIG. 16 is a diagram illustrating an ADS trellis.
Figure 17:
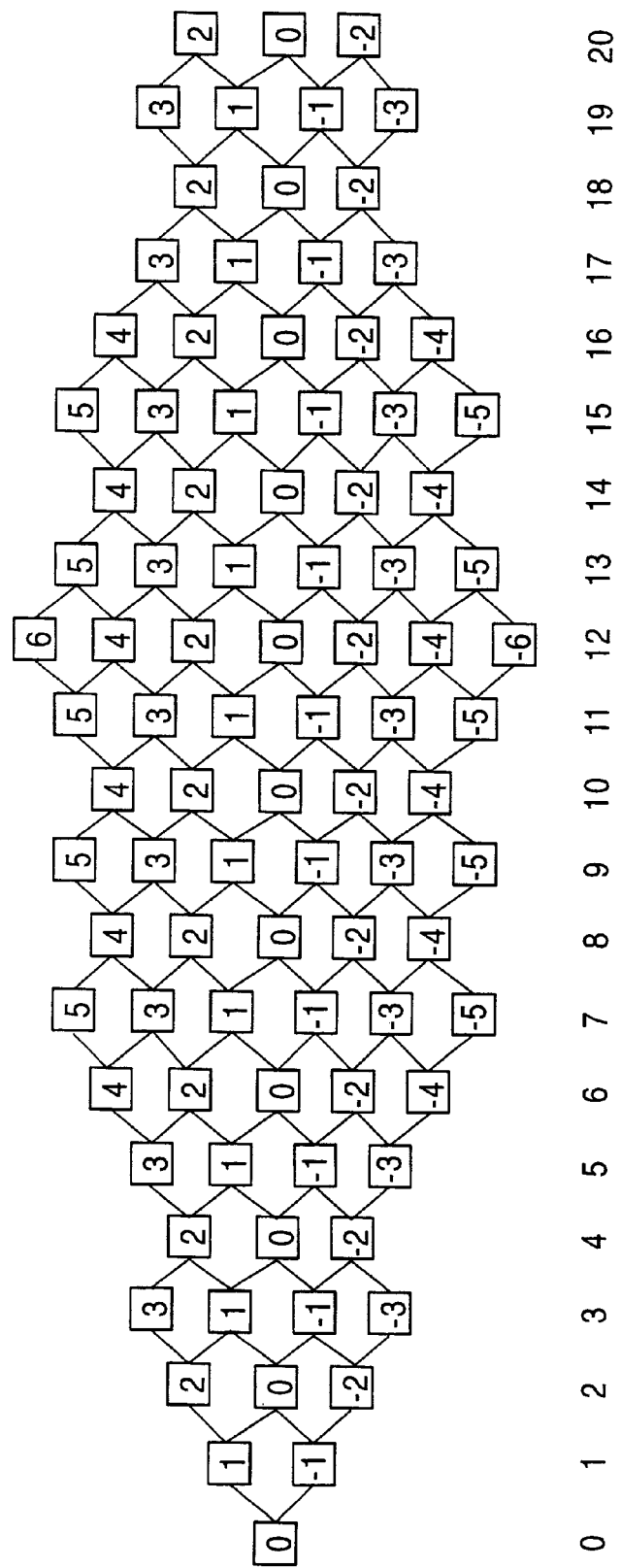
FIG. 17 is a diagram illustrating an ADS trellis.
Figure 18:
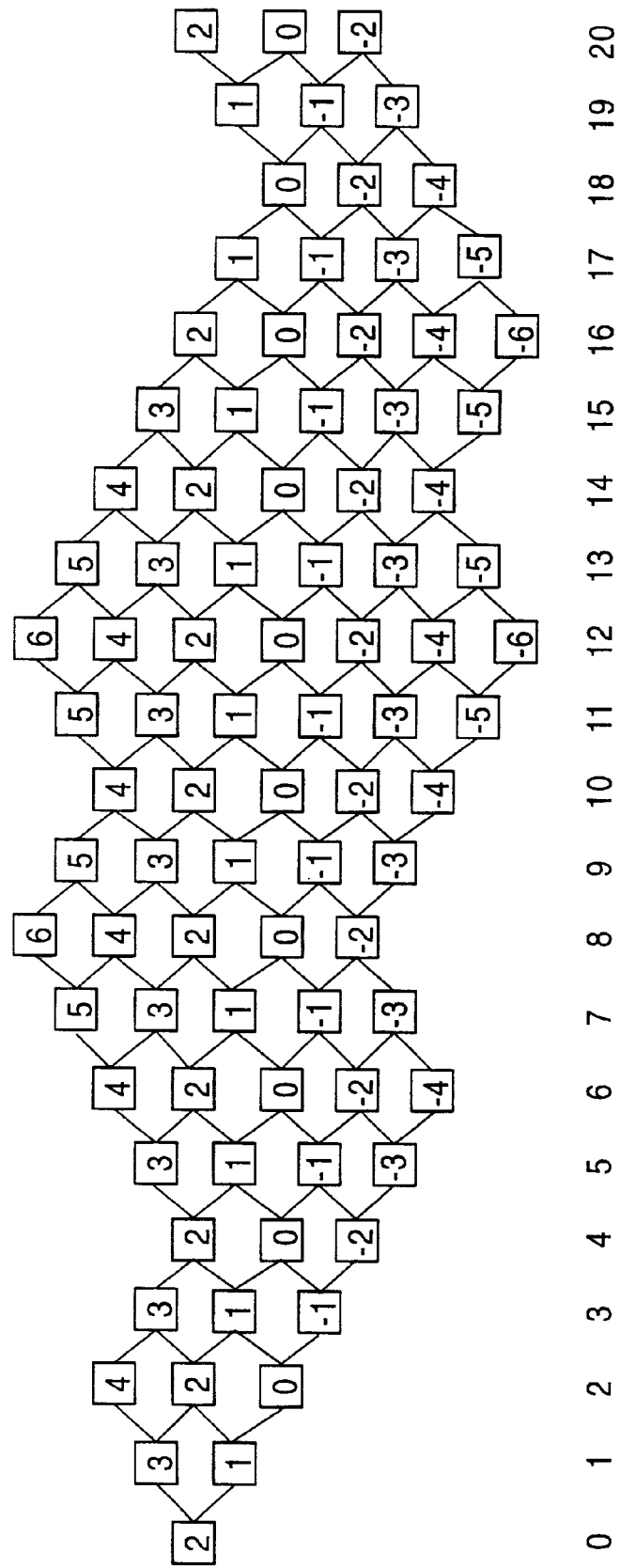
FIG. 18 is a diagram illustrating an ADS trellis.

FIGS. 16–18 illustrate a trellis (ADS trellis) representing transitions in the ADS of 20-bit codes output by the encoder 1 wherein the single ADS trellis is divided into a plurality of parts shown in FIGS. 16 to 18 respectively according to the ADS value at the start point. More particularly, FIG. 16 illustrates a part of the ADS trellis in which the ADS value starts with −2, FIG. 17 illustrates a part in which the ADS starts with 0, and FIG. 18 illustrates a part in which the ADS starts with 2. The ADS trellis is of a minimum and necessary form including all possible transitions generated by 20-bit codes.

Figure 19:
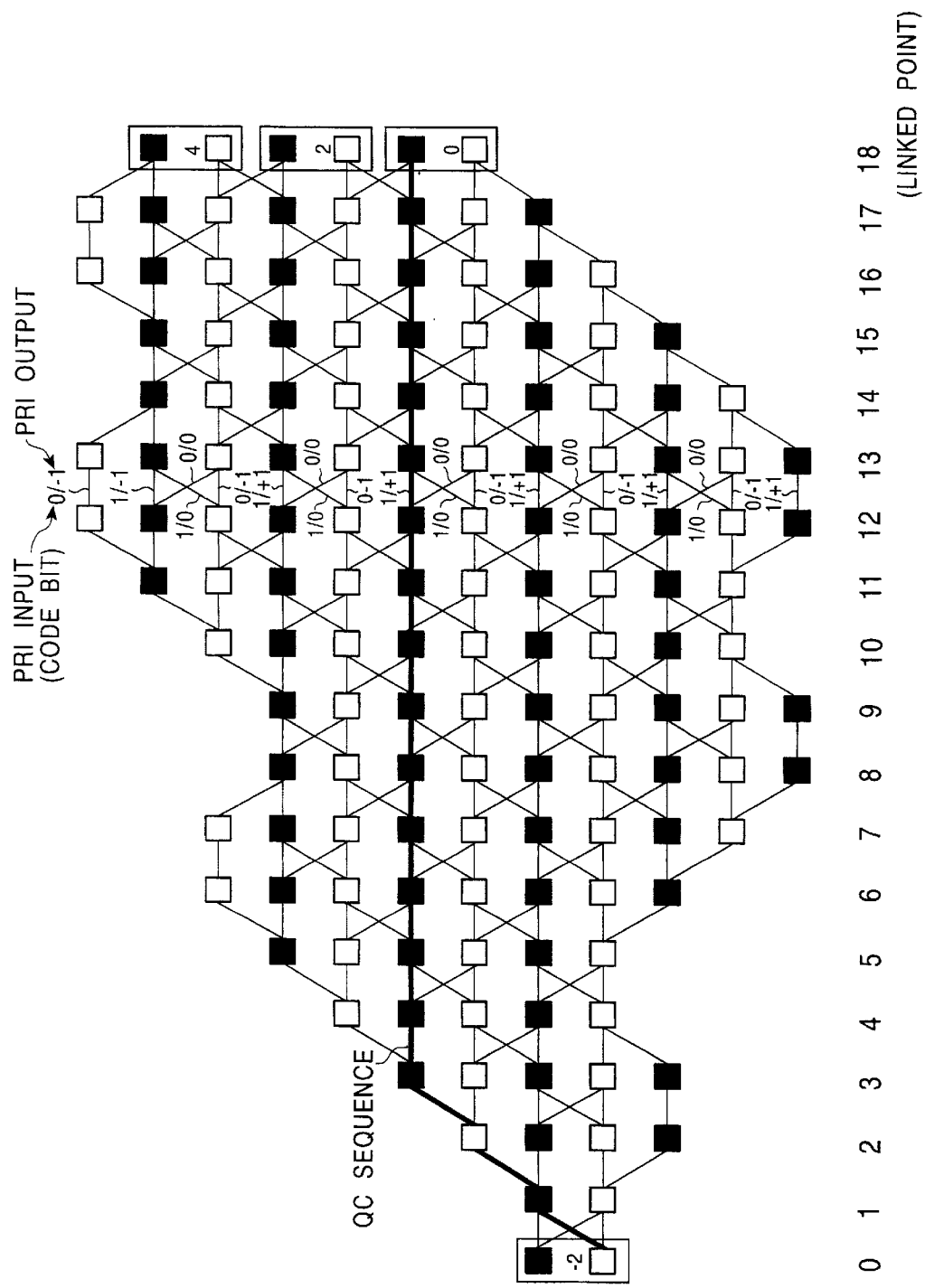
FIG. 19 is a diagram illustrating a detection trellis.
Figure 20:
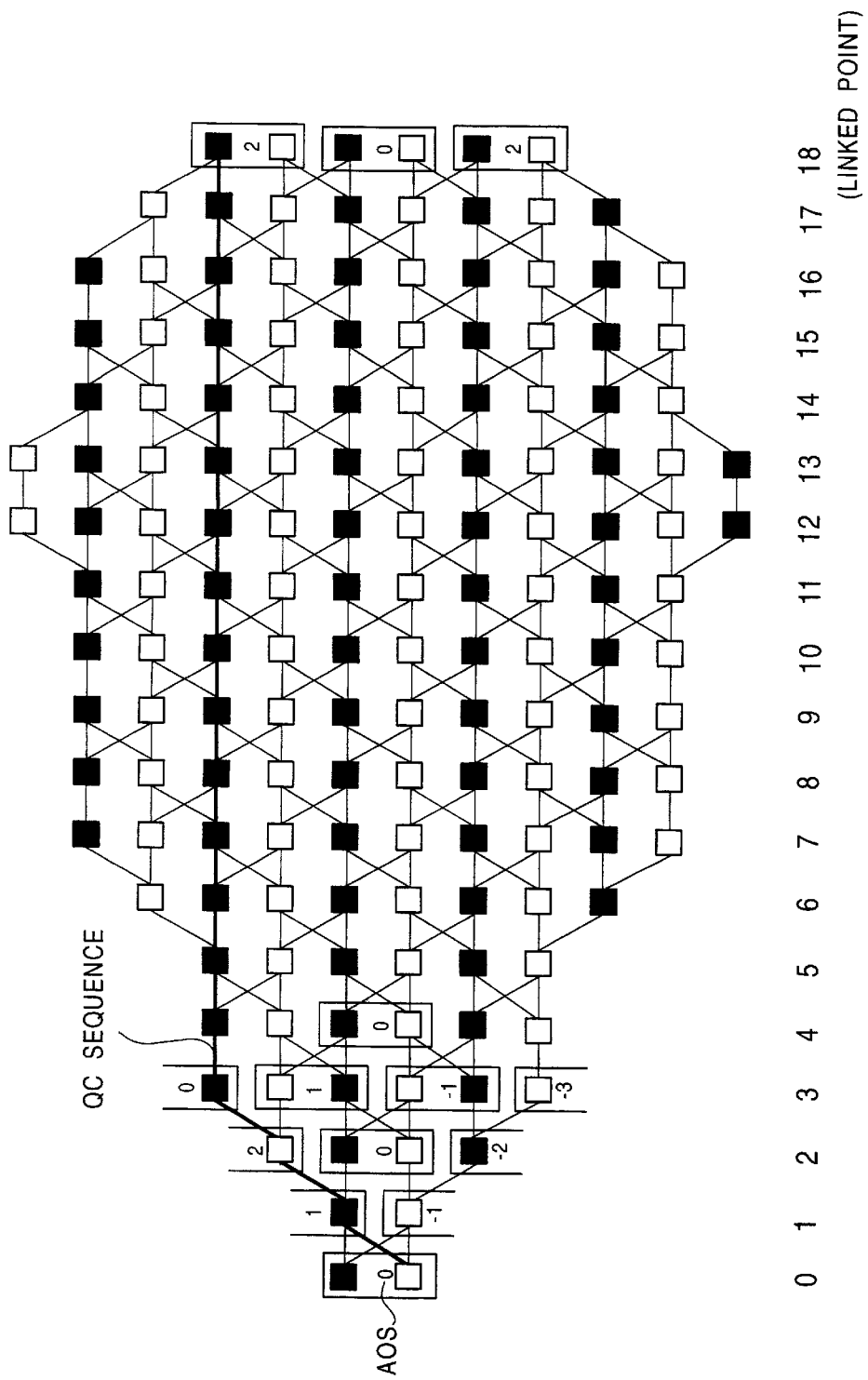
FIG. 20 is a diagram illustrating a detection trellis.
Figure 21:
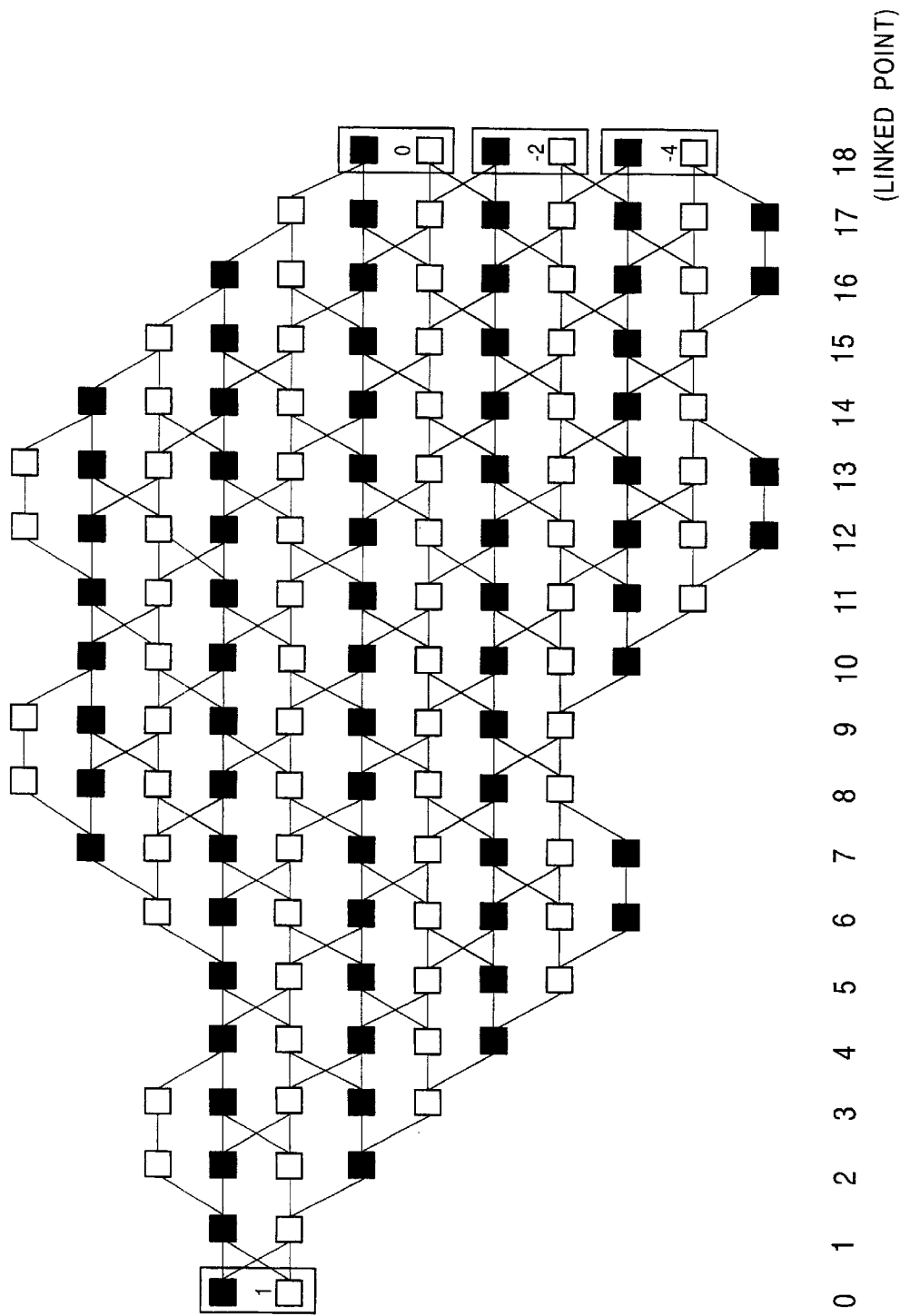
FIG. 21 is a diagram illustrating a detection trellis.

FIGS. 19 to 21 illustrate a detection trellis applied to PR1 to decode a 20-bit code generated by the encoder 1 wherein the single detection trellis is divided into a plurality of parts shown in FIGS. 19 to 21, respectively, according to the ADS value at the start point. More particularly, FIG. 19 illustrates a part of the detection trellis in which the ADS value at the start point is equal to −2, FIG. 20 illustrates a part in which the ADS value at the start point is equal to 0, and FIG. 21 illustrates a part in which the ADS value at the start point is equal to 2. FIGS. 19 to 21 are partial representation of a full detection trellis. That is, the diagrams in FIGS. 19 to 21 include only the part from the start point to a linked point of a 20-bit code (at the 18(=9+9)th bit in this example). The detection trellis given herein is of a minimum and necessary form including all possible states generated by 20-bit codes.

As described earlier, each of two 10-bit codes which are not interleaved yet by the encoder 1 has an RDS value equal to 3 at the start point and 5 at the end point. The ADS of an interleaved 20-bit code is equal to the sum of the RDS of one of the two uninterleaved codes and the RDS of a code obtained by inverting all bits of the other one of the two uninterleaved codes. More specifically, the ADS of an interleaved 20-bit code is equal to 3 −3, 3 5, 5 −5, or 5 −3, that is, −2, 0, or 2 at the start point and the end point.

When the ADS at the start point is equal to 0, the ADS trellis may be divided into further two parts according to whether the RDS values of both two uninterleaved 10-bit codes are equal to 3 or 5. However, in practice, it is difficult to distinguish the above two cases in Viterbi detection. Besides, the further division would not provide a great benefit. Therefore, no such division is performed in the ADS trellis or detection trellis for the case where the ADS at the start point is equal to 0, as shown in FIG. 17 or 20.

When a 20-bit code generated by the encoder 1 is applied to PR4, if Viterbi detection is performed using a detection trellis which is divided into a plurality of parts according to the RDS value at the start point as in the previous example, then it is possible to eliminate transitions which result in quasi-catastrophic sequences and which are not actually generated by any code.

However, when a 20-bit codes generated by the encoder 1 is applied to PR1 (or when applied to any partial response represented by a transfer polynomial in the form of (1+D)n), the code generation rule shown in FIG. 4 is not reflected in the detection trellis in the divided form as a result of successive intersymbollic interference in PR1. Therefore, even in the detection trellis which is divided in parts as shown in FIGS. 19 to 21 according to the ADS value at the start point, there can be transitions which result in quasi-catastrophic sequences (hereinafter such transitions will be referred to as invalid transitions).

In any 20-bit code generated by the encoder 1, the ADS in a certain state is given by the sum of the RDS of one of two uninterleaved 10-bit codes and the RDS of a code obtained by inverting all bits of the other one of the uninterleaved 10-bit codes (hereinafter such an RDS will be referred to as an inverted RDS). Therefore, the ADS of an interleaved 20-bit code can take, at a certain point of the trellis, not only values which can be taken by uninterleaved 10-bit codes but also some values which cannot be taken by the uninterleaved 10-bit codes.

More specifically, for example in the ADS trellis shown in FIG. 17 and also in the detection trellis shown in FIG. 20, the state at the 4th bit in which the ADS has a value of 0 corresponds to either the case where the RDS values at the 2nd bits of two uninterleaved 10-bit codes, shown in FIGS. 6A and 6B, are both equal to 3 (3−3=0) or the case where the RDS values at the 2nd bits are both equal to 5 (5−5=0).

However, the sum of an RDS value and an inverted RDS value can be equal to 0 even when the RDS values of two uninterleaved 10-bit codes are not equal to 3 or 5, but instead equal to for example 1 or 7. In fact, the trellis shown in FIG. 17 and that shown in FIG. 20 include paths corresponding to 1 in RDS (as represented by thick solid lines in FIGS. 17 and 20) and paths corresponding to 7 in RDS (as represented by broken lines in FIGS. 17 and 20).

In the trellis shown in FIGS. 6A and 6B, the RDS is inhibited from having a value of 1 or 7 at the 2nd bit, as described above, and therefore the encoder 1 generates no 10-bit code which results in 1 or 7 in RDS at the 2nd bit. This means that, in the trellis shown in FIG. 17 and that shown in FIG. 20, transitions which results in an ADS value of 0 at the 4th bit include invalid states which cannot be generated by any code. For example a transition which has an ADS value of 1 or 7 at the 2nd bit of a 10-bit code is invalid.

As discussed above, in the case of PR1, it is impossible to eliminate all invalid states which are not generated by any code even if the ADS trellis or the detection trellis constructed in a divided form.

In the trellises shown in FIGS. 17 and 20, the paths to 0 in ADS at the 4th bit include both invalid states which cannot be generated by any code and valid states which can be generated by a code. This means that it is impossible to remove only those invalid states from the ADS trellis shown in FIGS. 6A and 6B.

When there is an invalid state in a detection trellis, whether the invalid state results in quasi-catastrophic sequences is a very important issue, because if the invalid state results in quasi-catastrophic sequences, a path memory for use in Viterbi detection cannot be constructed in a form with a finite length.

The quasi-catastrophic sequences, as described earlier, refer to two or more paths which correspond to a particular code sequence and which run an infinite length on a trellis diagram. The detection trellis shown in FIGS. 19–21 includes a great number of quasi-catastrophic sequences (some of which are denoted by diagonal lines in FIGS. 19 and 20). If the trellis includes only those transitions generated by 10-bit codes, no quasi-catastrophic sequences must occur. However, in reality, the trellis includes invalid states because the code generation rule shown in FIG. 6 is not reflected in the ADS trellis or in the detection trellis, and therefore quasi-catastrophic sequences occur.

As described above, in the case of PR1, even if a detection trellis is divided into a plurality of parts according to the ADS value at the start point, it is impossible to eliminate quasi-catastrophic sequences, because the resultant divided parts of the detection trellis can include an invalid state. In conclusion, division of a detection trellis cannot provide an advantage. On the contrary, if a detection trellis is constructed in a divided form, the overall number of states is given by the sum of the numbers of states of divided parts of the detection trellis, and thus large-sized hardware is required to construct a Viterbi detector.

Figure 22:
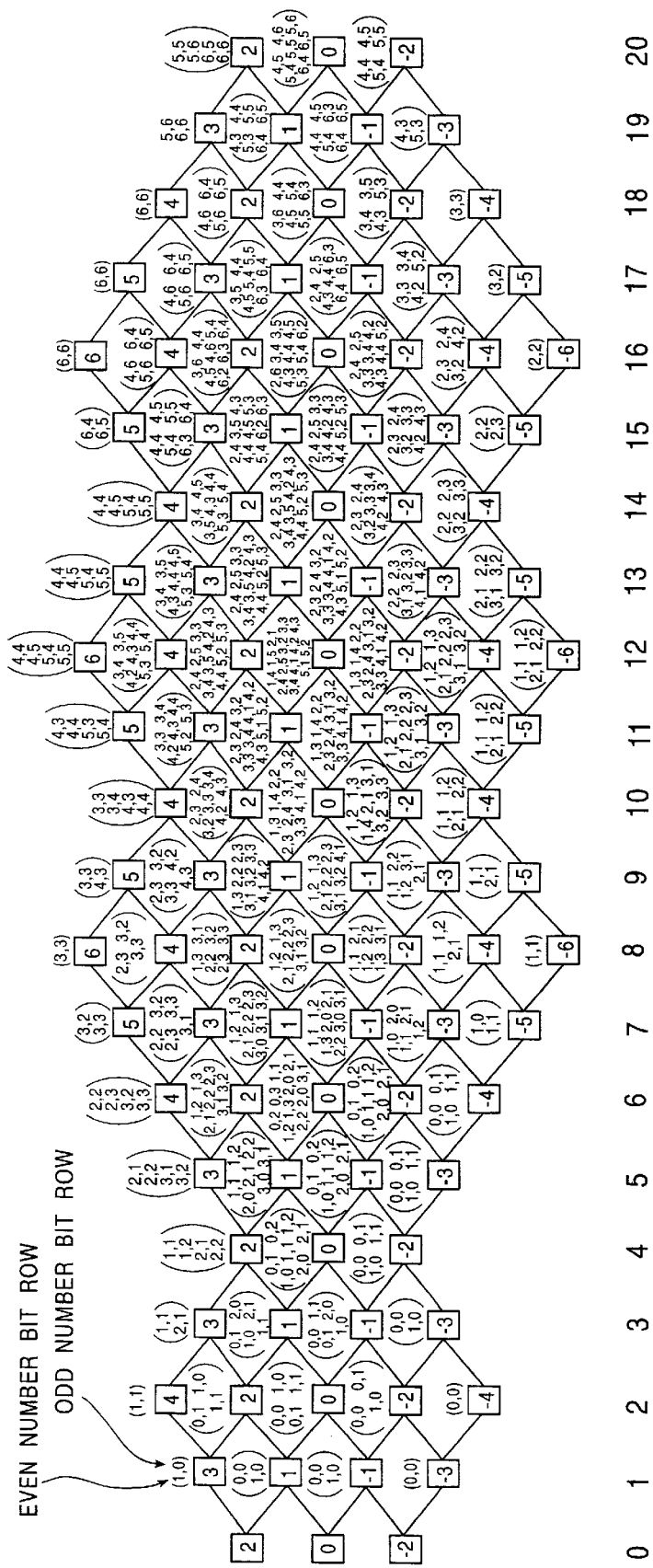
FIG. 22 is a diagram illustrating an ADS trellis.
Figure 23:
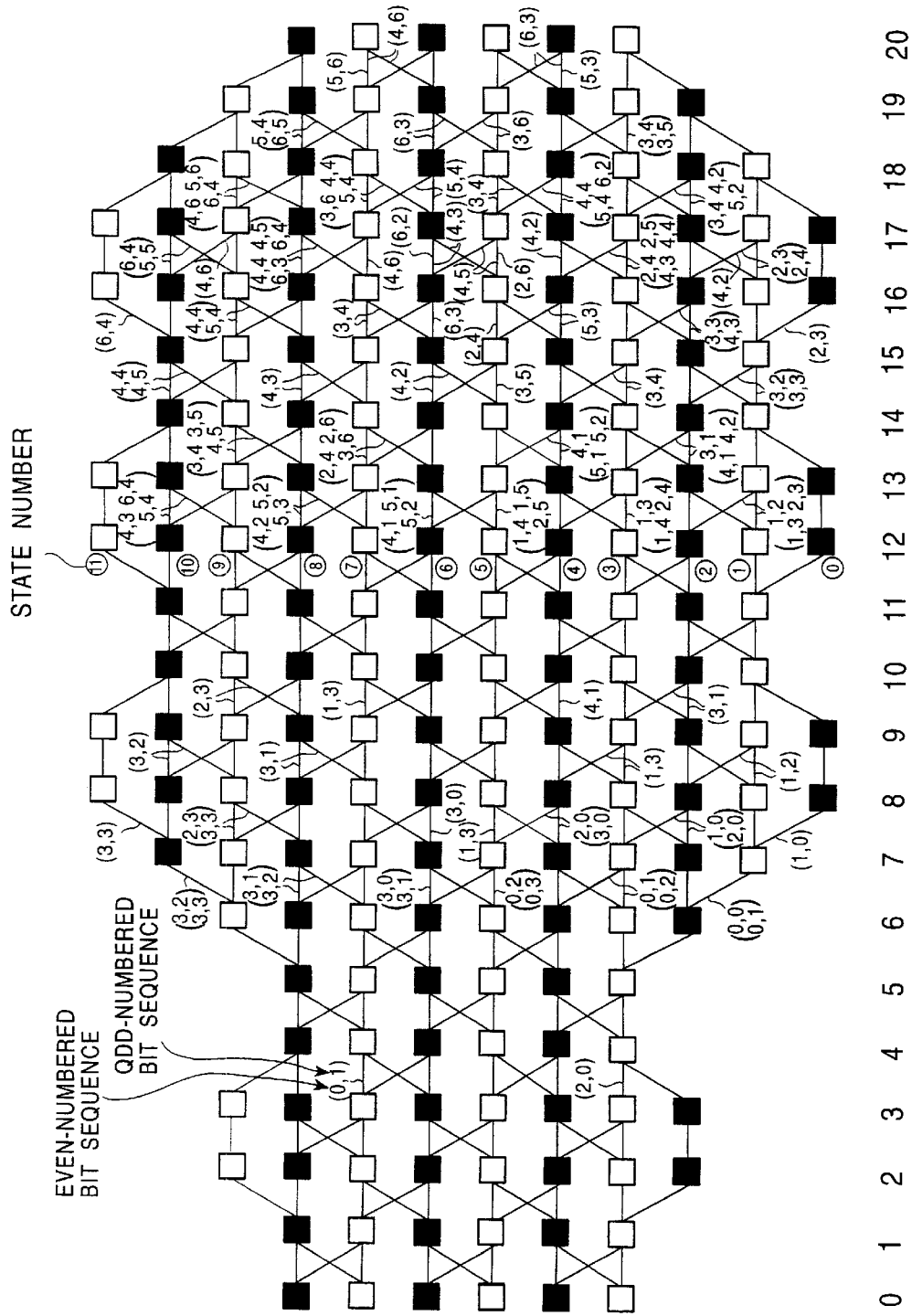
FIG. 23 is a diagram illustrating a detection trellis.

FIG. 22 illustrates an ADS trellis for a 20-bit code, which is constructed in a single form by combining three parts of the ADS trellis shown in FIGS. 16–18. FIG. 23 illustrates an ADS trellis for a 20-bit code, which is constructed in a single form by combining three parts of the ADS trellis shown in FIGS. 19–21. In the detection trellis shown in FIG. 23 (and also in other detection trellises shown elsewhere), open squares indicate that state transitions to those open squares occur in response to 0 in Viterbi detection result, and solid squares indicate that state transitions to those solid squares occur in response to 1 in Viterbi detection result.

Figure 34:
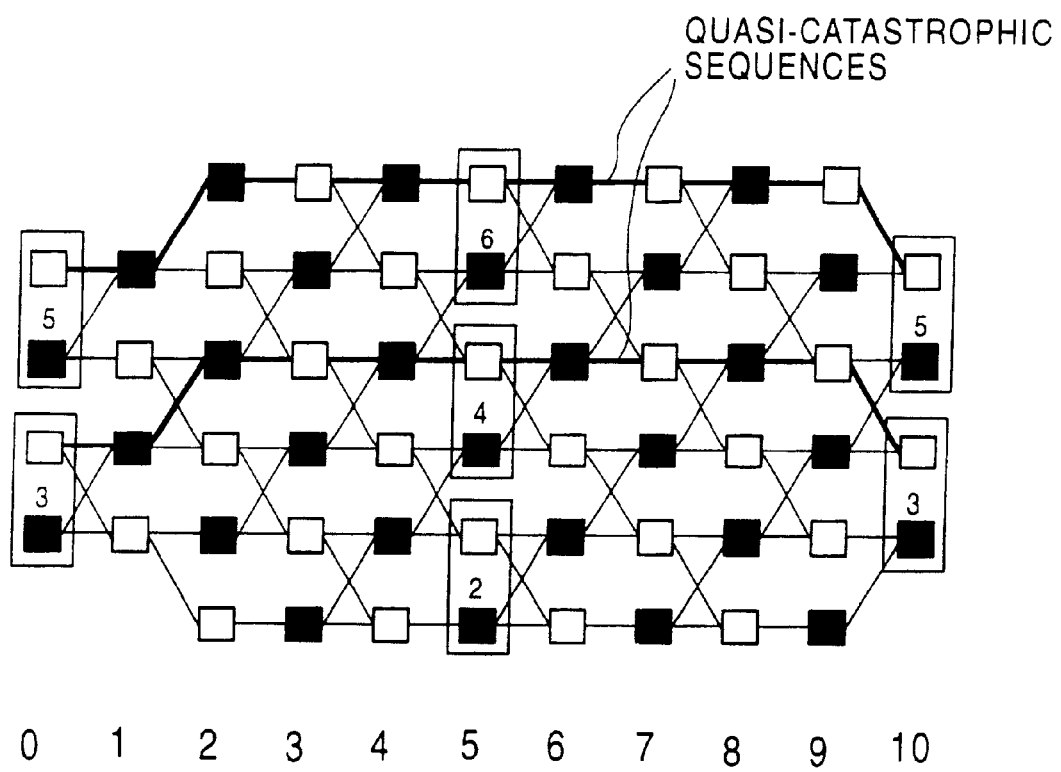
FIG. 34 is a detection trellis in an undivided form.
Figure 35:
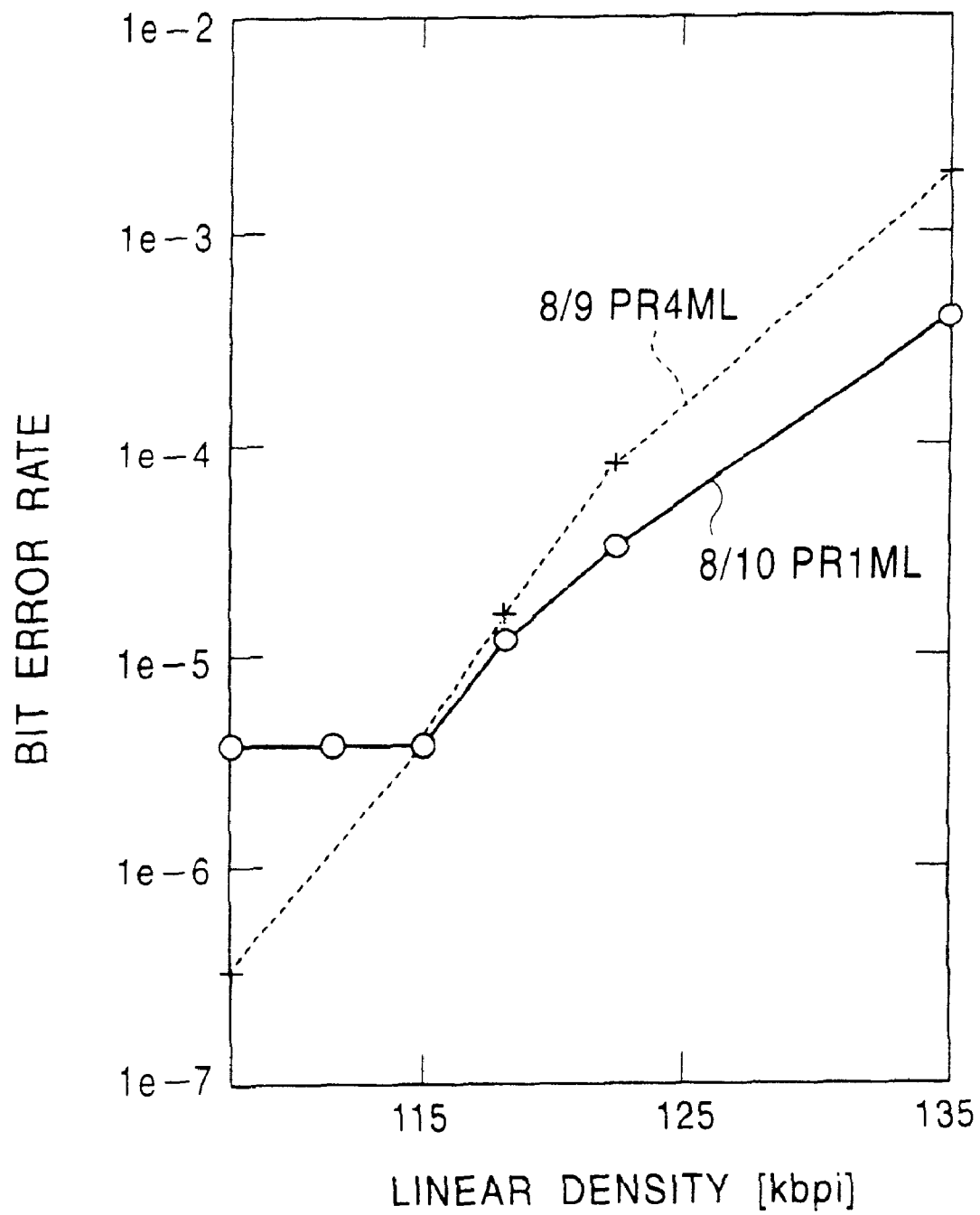
FIG. 35 is a graph illustrating the relationship between recording density and error rate for both PR1 and PR4.

In parts of the trellis shown in FIGS. 16–18 and also in parts of the trellis shown in FIGS. 19–21, the maximum number of states is equal to 12, and therefore the total number of states is equal to 36 (=12×3). In contrast, the maximum number of states, that is, the total number of states, for the trellis shown in FIG. 22 or 23 is equal to 12. As can be seen from the above description, when the detection trellis is constructed in the divided form, the total number of states is 3 times greater than that of the detection trellis in the single form. Therefore, the dividing of the detection trellis results in a great increase in the size of the Viterbi detector. In general, the number of states at respective points in a detection trellis in a divided form is greater than that in a single form. For example, although the number of states in the detection trellis in the single form shown in FIG. 34 is equal to 6, the number of states in the detection trellis in the divided form shown in FIG. 32 has a maximum value of 10 at the 3rd bit and also at the 4th bit.

In an preferred mode of the present invention, for the above reason, a detection trellis is constructed in an undivided form. Furthermore, whether each state transition (branch) (which is expected to occur to generate a 1-bit code) is generated by a code or not is determined on the basis of the number of 1s or 0s included in a 10-bit code corresponding to a path ending at that branch detected in the Viterbi detection process, or on the basis of the calculated RDS value corresponding to the number of 1s or 0s. If the path is determined to be a path which cannot be generated by any code, the path is removed or alternatively the path metric associated with that path is added with a predetermined fixed value so as to reduce the degree of likelihood associated with that path thereby preventing quasi-catastrophic sequences from occurring.

As described above, judgement as to whether a path is generated by a code or not may be performed on the basis of the total number of 1s or 0s included in a 10-bit code or on the basis of the RDS value. Instead, in the present embodiment, judgement is performed on the basis of the total number of 1s included in a sequence of even-numbered bits which is one of two 10-bit codes interleaved in a 20-bit code and which corresponds to a certain path, and on the basis of the total number of 0s included in a sequence of odd-numbered bits which is the other 10-bit code.

When a given 20-bit code is represented by (a0, b0, a1, b1, a2, b2, a3, b3, a4, b4, a5, b5, a6, b6, a7, b7, a8, b8, a9, b9), and it is recorded in this order, the judgement is performed on the basis of the number of 1s included in the sequence of even-numbered bits (a0, a1, a2, a3, a4, a5, a6, a7, a8, a9), and on the basis of the number of 0s included in the sequence of odd-numbered bits (b0, b1, b2, b3, b4, b5, b6, b7, b8, b9). In this case, in the ADS trellis shown in FIG. 22 and in the detection trellis shown in FIG. 23, bit a0 corresponds to a branch emerging from a state at the 0th bit (start point) and ending at a state at the 1st bit, and bit b0 corresponds to a branch emerging from a state at the 1st bit and ending at a state at the 2nd bit. The other bits also correspond to branches in a similar manner.

Hereinafter, the number of 1s included in a sequence of even-numbered bits and the number of 0s included in a sequence of odd-numbered bits are referred to as Hamming weights.

In FIGS. 6A and 6B, the RDS associated with each state has a one-to-one correspondence with the Hamming weight. This is the reason why it is possible to determine whether a branch in a certain path is a valid transition generated by a code on the basis of the Hamming weight associated with a 10-bit code corresponding to that path. In FIG. 6A, for example, a state having an RDS value of 3 at the 2nd bit corresponds to 1 in the number of 1s, because a 2-bit code, which is generated in a path from the start point where the RDS is equal to 3 to the state at the 2nd bit where the RDS is equal to 3, must have a 0 at either bit of the two bits and a 1 at the other bit.

Similarly, a state having an RDS value of 5 at the 2nd bit corresponds to 2 in the number of is. In the case where the number of 1s at the 2nd bit is equal to 0, if the RDS at the start point is equal to 3, then the RDS at the 2nd bit must be equal to 1. However, there is no such a state in FIG. 6A. Therefore, it can be concluded that a transition to such a state is an invalid state which cannot be generated by any code. The above discussion also holds in FIG. 6B.

Figure 24:
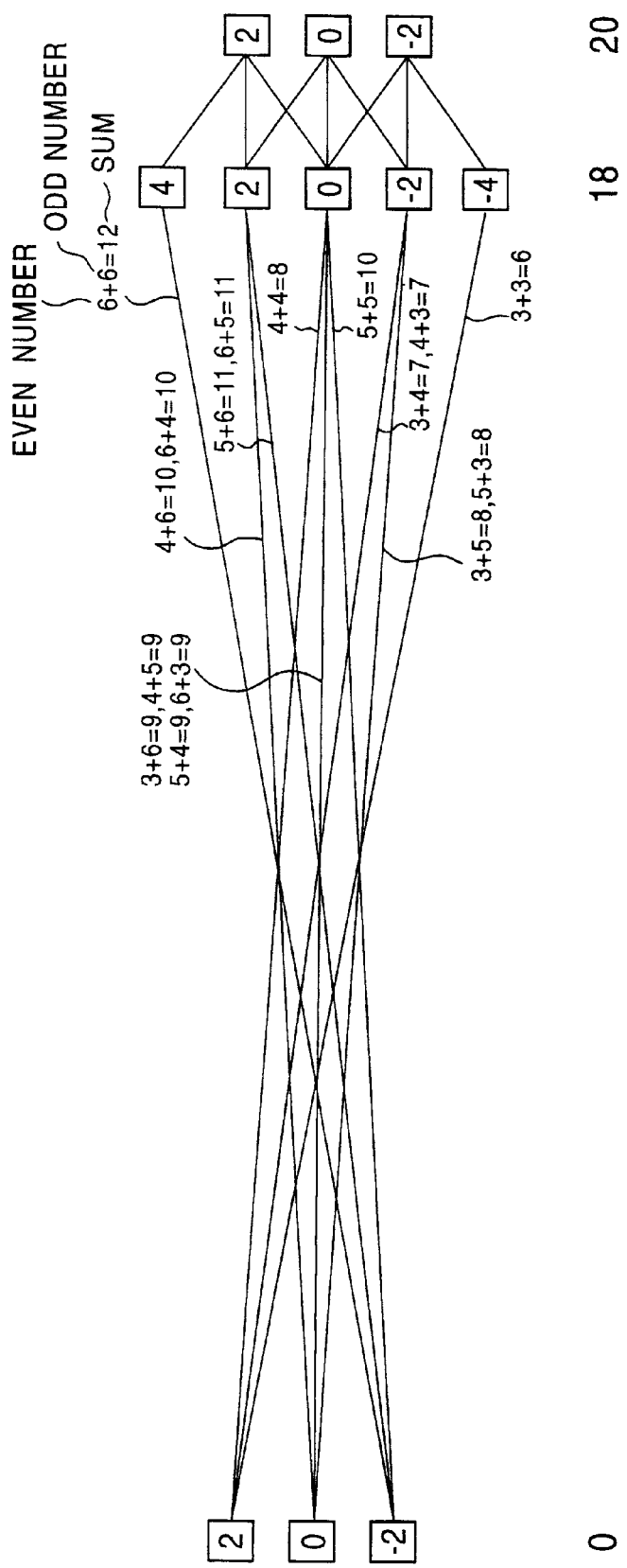
FIG. 24 is a diagram illustrating an ADS trellis.

FIG. 24 is an ADS trellis diagram obtained by extracting the start points, linked points, and end points from the ADS trellis shown in FIG. 22 (because an uninterleaved 10-bit code has a linked point at the 9th bit (FIGS. 4, 6A, 6B), an interleaved 20-bit code has a linked point at the 18th bit).

In FIG. 24, squares represent states, and solid lines between any two squares correspond to state transitions which can be generated by a 20-bit code. In other words, any transition between two states which are not connected by a solid line is invalid. For example, a transition from a point having an ADS value of 0 to a state having an ADS value of 4 at the 18th bit is invalid.

In FIG. 24, there are shown Hamming weights for both even-numbered and odd-numbered bit sequences obtained by transitions generated by 20-bit codes and also shown all the sum of Hamming weights. In these values, the code generation rule shown in FIG. 4 which generates no quasi-catastrophic sequences is reflected. Therefore, quasi-catastrophic sequences can be avoided by determining whether a transition is a valid transition which can be generated by a code, on the basis of those values.

In the ADS trellis of FIG. 22, there are shown Hamming weights associated with sequences of even-numbered and odd-numbered bits obtained by transitions generated bit by bit by a code. On the basis of the Hamming weights shown in FIG. 22, it is possible to extract those branches which can be invalid. In the detection trellis in FIG. 23, those branches which have numerals shown on the side thereof are such branches which can be invalid, wherein these numerals denote the corresponding Hamming weights of the sequences of even-numbered bits and odd-numbered bits.

In the detection trellis shown in FIG. 23, if the Hamming weights at the start point of a certain branch are equal to the values indicated on the side of the corresponding branch, then the state transition corresponding to that branch is invalid.

Although either the detection trellis shown in FIG. 23 or the ADS trellis shown in FIG. 24 may be used to remove paths including invalid transitions, the detection trellis shown in FIG. 23 is employed here.

Figure 25:
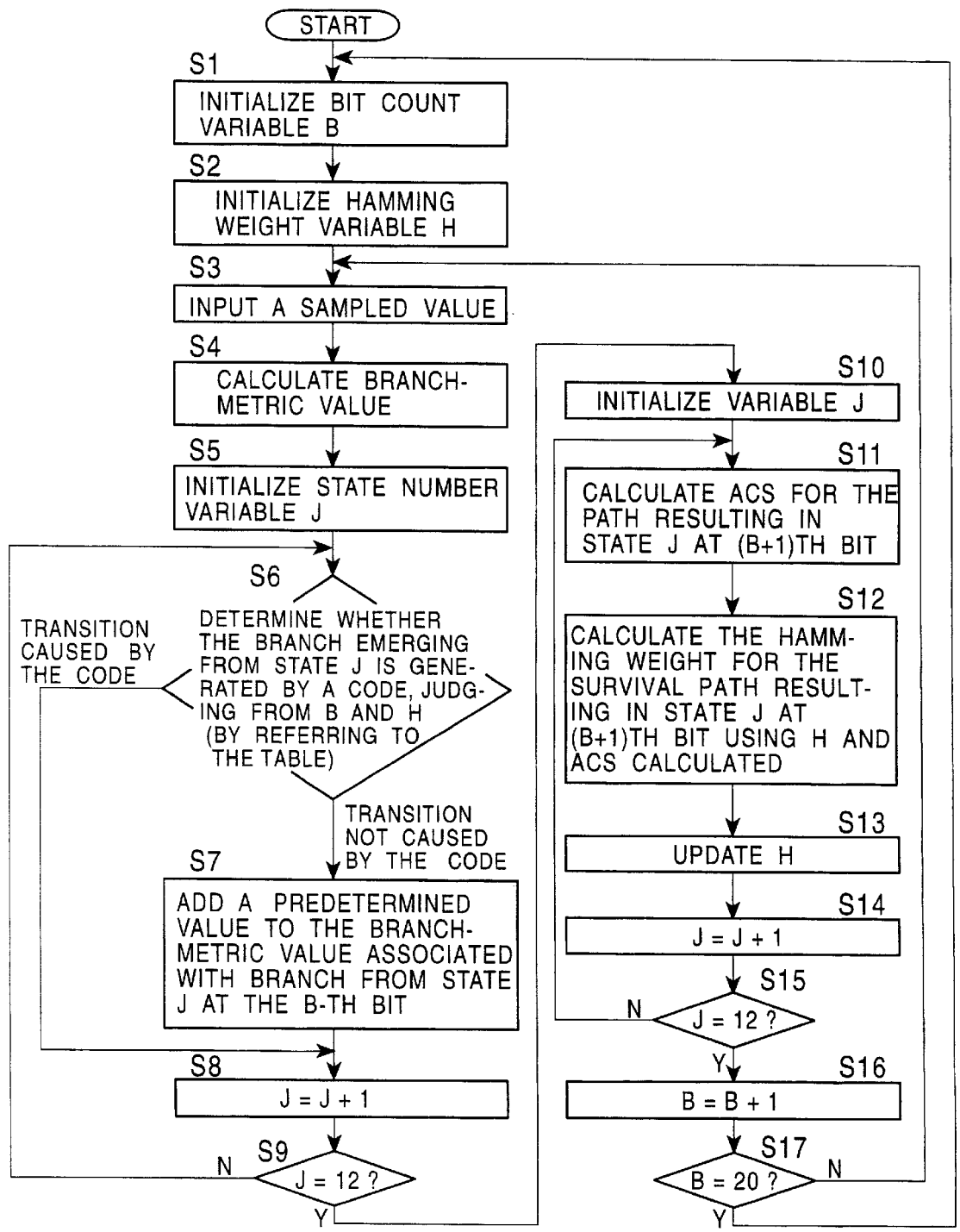
FIG. 25 is a flow chart illustrating the process performed by the Viterbi detector shown in FIG. 1.

FIG. 25 is a flow chart illustrating the algorithm for detecting (determining) invalid transitions using the detection trellis and removing the detected invalid transitions thereby ensuring that Viterbi decoding is performed correctly and efficiently.

In the first step S1, a variable B indicating which bit of a 20-bit code is to be processed is initialized to for example 0. In the next step S2, a variable H indicating Humming weights for a surviving path to each state at the Bth bit is initialized to for example 0.

In the present embodiment, the maximum number of states is, as described above, equal to 12, and two Humming weights are required, one of which is used for a sequence of even-numbered bits, and the other of which is used for a sequence of odd-numbered bits. Therefore, the variable H includes as many values as needed to represent Humming weights for both even-numbered and odd-numbered bit sequences and for all twelve states.

In step S3, if a sampled value including noise is input from a sampler 6, then the process goes to step S4. In step S4, branch metrics BM1, BM0, BM+1 corresponding to three reference levels −1, 0, and +1, respectively, are calculated for the given sampled value.

Then in step S5, a variable J indicating the state number of a state under consideration is initialized to for example 0, and the process goes to step S6. In step S6, on the basis of the Humming weights H associated with surviving paths to the state specified by the state number J at the Bth bit, it is determined whether a state transition corresponding to a branch from the state with the state number J at the Bth bit to a state at the (B+1)th bit is a valid transition which can be generated by a code or an invalid transition which cannot be generated by any code.

The determination process in step S5 is performed by referring to a decision table which has been prepared in advance.

Figure 27:
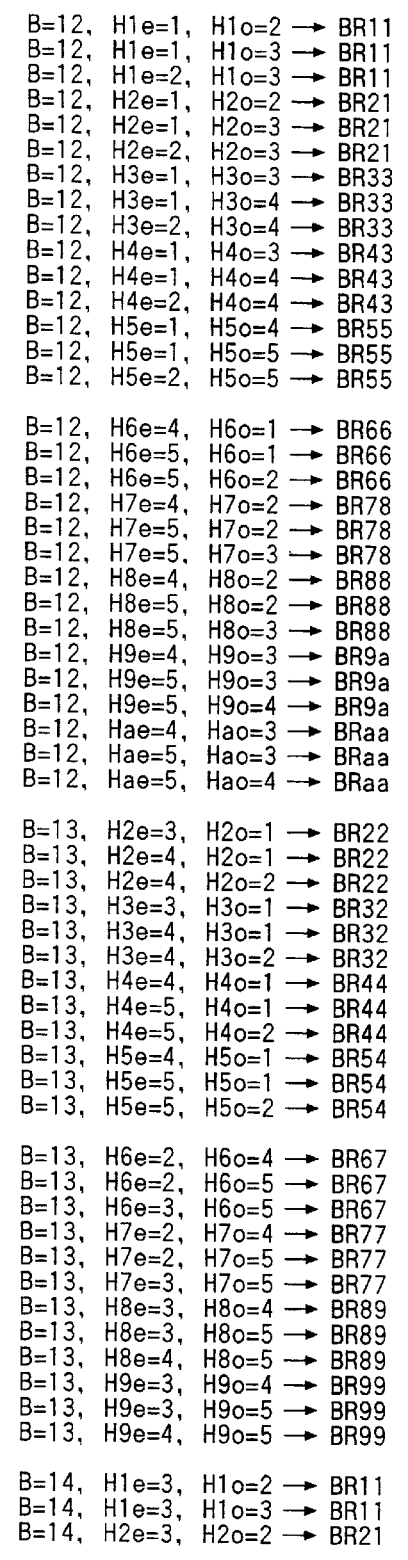
Figure 28:
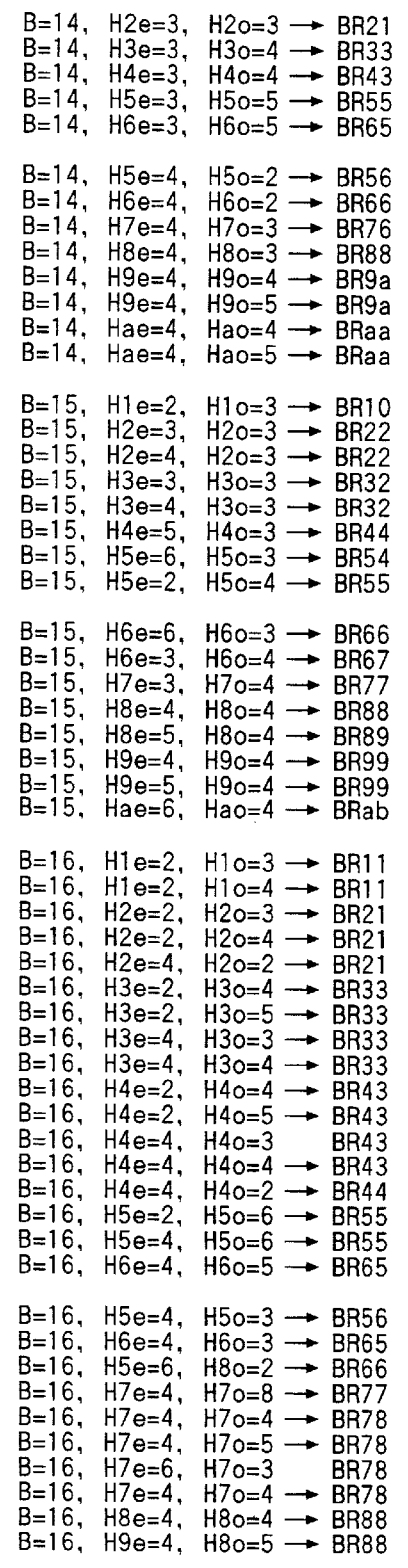

FIGS. 26 to 29 illustrate decision tables. These decision tables represent the relationship between the Hamming weights in the detection trellis shown in FIG. 23 and branches corresponding to invalid transitions. Each numeral following "B=" in the extreme left column indicates which bit in the detection trellis corresponds to the bit of the code under evaluation. Numerals following "H" in the second and third columns each indicate the state number, wherein "e" following the state number indicates that the Hamming weight is for a sequence of even-numbered bits and "o" following the state number indicates that the Hamming weight is for a sequence of odd-numbered bits. A numeral following "=" indicates the Hamming weight. For example, "H4e=2" in the second column in the first line indicates a case in which the Hamming weight associated with a sequence of even-numbered bits has a value of 2 at a state with a state number of 4. Similarly, "H4o=0" in the third column in the same line indicates a case in which the Hamming weight associated with a sequence of odd-numbered bits has a value of 0 at the state with a state number of 4.

In the decision tables, two numerals following "BR" in the extreme right column following an arrow "→" each indicate state numbers. "BR" is an abbreviation for "branch". Thus, for example, "BR44" in the extreme right column in the first line in FIG. 26 indicates a branch emerging from a state with a state number of 4 and ending at a state with a state number of 4.

In each line of the decision tables, with conditions represented on the left side of the arrow are satisfied, then the branch indicated by the expression on the right side of the arrow is a branch corresponding to an invalid transition.

Figure 26:
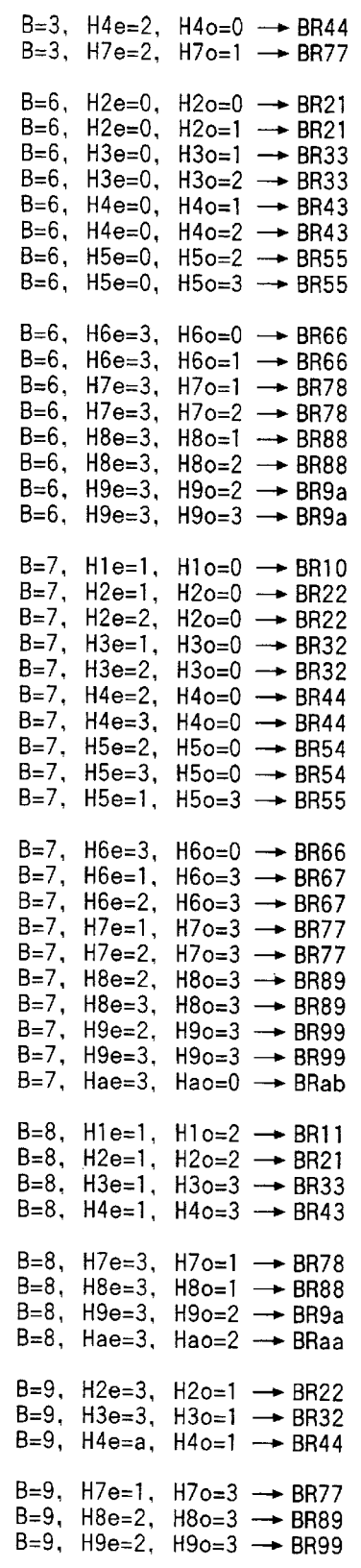

For example, when the 3rd bit of a code is under evaluation, if 2 and 0 are given for the Hamming weights associated with sequences of even-numbered and odd-numbered bits, respectively, in a state with a state number of 4, then the conditions (B=3, H4e=2, H4o=0) represented on the left side of the arrow in the first line in FIG. 26 are satisfied, and therefore a transition corresponding to a branch (BR44) from a state with a state number of 4 to a state with a state number of 4 is invalid.

In the detection trellis, as shown in FIG. 23, successive integers from 0 to 11 are assigned as state numbers to respective states from the bottom toward the top in the figure, as indicated by numbers each surrounded by circles. In the decision tables in FIGS. 26 to 29, state numbers 10 and 11 in decimal are represented by "a" and "b", respectively.

In step S6, if it is determined that the state transition corresponding to the branch from the state J at the Bth bit to a state at the (B+1)th bit is an invalid state which cannot be generated by any code, then the process goes to step S7. In step S7, a predetermined fixed value is added to the branch metric corresponding to the invalid state described above so that the degree of likelihood associated with the path including that branch is decreased. Then the process goes to step S8.

In step S6, if it is determined that the state transition corresponding to the branch from the state J at the Bth bit to the state at the (B+1)th bit is a valid state which can be generated by a code, then step S7 is skipped and the process goes to step S8.

In step S8, the variable J indicating the state number is incremented by 1, and the process goes to step S9 in which it is determined whether the variable J is equal to 12 which is the maximum number of states. If it is determined in step S9 that the variable J is not equal to 12, then the process returns to step S6 to perform similar process on another branch (state transition) emerging from another state.

On the other hand, if it is determined in step S9 that the variable J is equal to 12, then the process goes to step S10. In step S10, the variable J is reset to 0, and the process goes to step S11. In step S11, an ACS (add compare select) calculation is performed with respect to paths which join to a state with a state number of J (hereinafter such a state will also be referred to simply as a state J) at the (B+1)th bit thereby determining which paths of those joining to the state J at the (B+1)th bit still survive.

In step S12, using the variable H associated with the Bth bit, the Hamming weights for the surviving paths joining to the state J at the (B+1)th bit are calculated. Then in step S13, the variable H is updated in accordance with the calculation result. That is, the Hamming weights for the surviving paths joining the state J at the (B+1)th bit are stored in the variable H associated with the state J, and then the process goes to step S14.

In step S14, as in step S8, the variable J is incremented by 1, and the process goes to step S15 in which it is determined, as in step S9, whether the variable J is equal to 12. If it is determined in step S15 that the variable J is not equal to 12, then the process returns to step S11 so as to update the variable H associated with another state.

On the other hand, if it is determined in step S15 that the variable J is equal to 12, then the process goes to step S16 in which the variable B indicating which bit of the code is under evaluation is incremented by 1. Then the process goes to step S17. In step S17, it is determined whether the variable B is equal to 20 which is the number of bits included in the code. If it is determined that the variable B is not equal to 20, then the process returns to step S3, and the above-described steps are repeated for another bit.

On the other hand, if it is determined in step S17 that the variable B is equal to 12, then the process returns to step S1 so as to perform a similar process from the beginning for another 20-bit code.

As described above, the Viterbi detector 7 shown in FIG. 1 performs Viterbi decoding on the playback signal thereby recovering the original 20-bit code.

FIG. 30 illustrates an example of the construction of the Viterbi detector 7 shown in FIG. 1.

The sampled value output from the sampler 6 is applied to a branch metric calculation block (branch metric calculation means) 101. The branch metric calculation block 101 calculates branch metrics BM-1, BM0, and BM+1 associated with the sampled value (in step S4), and the calculated branch metrics are supplied to a constant addition block 102 and also to a selector 103. The constant addition block (conversion means) 102 adds a predetermined fixed value to the branch metrics received from the branch metric calculation block 101 so as to decrease the likelihood degrees associated with the respective branch metrics. After being added with the predetermined fixed value, the branch metrics are supplied from the constant addition block 102 to the selector 103.

Thus, the selector 103 receives the branch metrics added with no fixed value and the branch metrics added with the fixed value for the same branch.

In accordance with a decision signal supplied from a code path determination block 107, the selector 103 selects either the branch metrics added with no fixed value or the branch metrics added with the fixed value (the branch metrics added with no fixed value are selected when the process goes from step S6 to S8 skipping step S7, and the branch metrics added with the fixed value are selected when the process goes from step S6 to S7), and the selected branch metrics are supplied to an ACS/state metric memory 104.

In addition to the branch metrics from the selector 103, the ACS/state metric memory 104 also receives the output of a sequence counter 108. The sequence counter 108 counts the bit of the code under evaluation, and the counted value (corresponding to the variable B described above with reference to the flow chart shown in FIG. 25) is output. On the basis of this counted value, the ACS/state metric memory 104 determines which bit of the code is being processed, and performs an ACS calculation using the branch metrics supplied from the selector 103 (in step S11) thereby determining which paths still survive. The result is given to a path memory 105 and a Hamming weight calculation/memory block 106.

The path memory 105 sequentially stores code sequences corresponding to the surviving paths, supplied from the ACS/state metric memory 104. When a single finally-surviving path is determined, the code sequence (detected data) corresponding to that path is output as a Viterbi decoding result to a decoder 8 (FIG. 1).

The Hamming weight calculation/memory block 106 calculates the Hamming weights corresponding to the survival paths supplied from the ACS/state metric memory 104, and stores the calculation result therein (steps S12, S13). The calculated Hamming weights are also supplied to the code path determination block 107 from the Hamming weight calculation/memory block 106.

In addition to the Hamming weights from the Hamming weight calculation/memory block 106, the code path determination block (detection means) 107 also receives the counted value from the sequence counter 108. The code path determination block 107 includes a table memory 107A for storing the decision table (shown in a divided fashion in FIGS. 26–29). By referring to this decision table, the code path determination block 107 determines whether the state transition at the bit indicated by the counted value supplied from the sequence counter 108 is valid or invalid (thus detecting an invalid transition) (in step S6). The code path determination block 107 outputs a decision signal corresponding to the determination result, to the selector 103.

If the decision signal indicates that the state transition is invalid, then the selector 103 selects the branch metrics added with the predetermined fixed value. On the other hand, if the decision signal indicates that the state transition is valid, then the selector 103 selects the branch metrics added with no fixed value. In any case, the selected values are stored in the ACS/state metric memory 104.

As a result, the degree of likelihood of a path including a branch corresponding to an invalid transition is decreased, so that such a path is not selected as a surviving path by the ACS/state metric memory 104. In this way, inadequate paths are removed.

In the detection trellis shown in FIG. 23, the number of states varies with the bit of a code. For example, although there are twelve states (numbered 0 to 11) from the 8th bit to 17th bit, there are only six states (numbered 3 to 8) at the 4th bit. Therefore, it is required that the Viterbi detector 7 should know which bit is being processed and should perform its operation in different manners depending on the bit.

Figure 31:
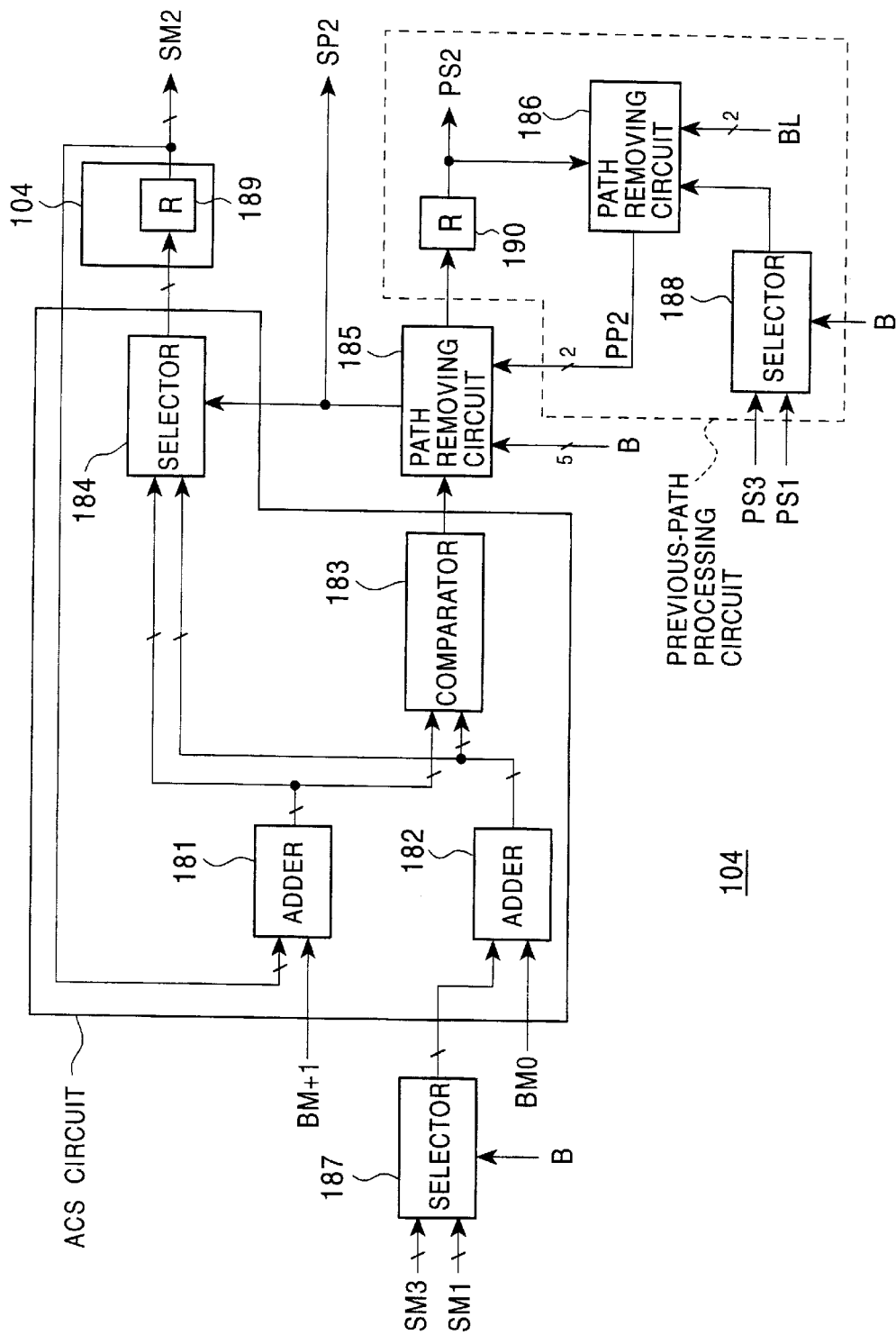
FIG. 31 is a block diagram illustrating an example of the construction of the ACS/state metric memory shown in FIG. 30.

To meet the above requirement, the ACS/state metric memory 104 in FIG. 30 may be constructed for example as shown in FIG. 31. In FIG. 31, there is shown only a part of the ACS/state metric memory 104 which corresponds to the state numbered 2 which is the 3rd state counted from the bottom in the detection trellis shown in FIG. 23.

In FIG. 31, an ACS circuit for performing ACS calculation is formed by an adders 181 and 182, a comparator 183, and a selector 184, while a register 189 is used as a state metric memory for storing path metrics (state metrics).

The ACS/state metric memory 104 further includes a path removal block 185 and a selector 187.

The selector 187 receives path metrics (state metric) SM1 and SM3 associated with paths joining to the states 1 and 3, respectively, from parts corresponding to the state 1 and 3 in the ACS/state metric memory 104 (those parts are not shown in FIG. 31). The selector 187 also receives the counted value B from the sequence counter 108 (FIG. 30), and selects either the path metric SM1 or SM3 in accordance with the counted value B.

Since the detection trellis shown in FIG. 23 is assumed to deal with a code sequence in which even-numbered bits and odd-numbered bits are alternately placed bit by bit, transitions from state 1 to state 2 and transitions from state 3 to state 2 occur alternately. Therefore, according to the detection trellis, the selector 187 selects a path metric corresponding to a starting state which can result in state 1 or 3.

The path metric selected by the selector 187 is supplied to the adder 182.

In addition to the path metric from the selector 187, the adder (path metric calculation means) 182 also receives a branch metric BM0. The adder 182 determines the sum of the path metric and the branch metric BM0, thereby determining the path metric associated with a path to the state 2 from the state corresponding to the path metric selected by the selector 187 (hereinafter such a path will also be referred to as a first path). The path metric associated with first path is supplied to the comparator 183 and the selector 184.

In addition to the path metric associated with the first path from the adder 182, the comparator 183 also receives the output of the adder 181. The adder (path metric calculation means) 181 also receives the branch metric BM+1 and the path metric SM2 associated with the path joining state 2, wherein the path metric SM2 is supplied from the register 189. The adder 181 determines the sum of the branch metric BM+1 and the path metric SM2, thereby determining the path metric associated with a path to the state 2 from the state 2 at the Bth bit (hereinafter such a path will also be referred to as a second path). As is the case of the path metric associated with first path, the path metric associated with the second path is also supplied to the comparator 183 and the selector 184.

The comparator 183 compares the path metric associated with the first path with that associated with the second path, and detects a smaller path metric which is higher in the degree of likelihood. The detection result is supplied from the comparator 183 to the path removal block 185.

In addition to the detection result from the comparator 183, the path removal block (control means) 185 also receives the counted value B from the sequence counter 108. The path removal block 185 knows how many states exist at each bit in the detection trellis shown in FIG. 23. In accordance with the detection result given by the comparator 183, the path removal block 185 generates a selection signal SP2 indicating a smaller path metric of those associated with the first and second paths. In response to the selected signal SP2 from the path removal block 185, the selector 184 selects the smaller path metric.

If the path metric detected by the comparator 183 corresponds to a path to or from a state which does not exist at the bit indicated by the counted value B, that is, if the path metric corresponds to a path which does not exist, then the path removal block 185 outputs a selection signal SP2 indicating the other path metric.

For example, when the comparator 183 detects the path metric associated with the first path of those associated with the first and second paths, if the first path does not exist and if only the second path exists, then the path removal block 185 outputs a selection signal indicating that the path metric associated with the second path should be selected.

In the case where neither the first path nor the second path exists, the path removal block 185 may output a selection signal SP2 indicating either path metric, because such a path will eventually be truncated.

A specific example of such a path removal block 185 is disclosed for example in U.S. Pat. No. 5,280,489.

According to the selection signal SP2, the selector (selection means) 184 selects a path metric associated with the first or second path. The selected path metric is supplied to the register and stored therein. The path metric SM2, which is stored in the register 189 and which corresponds to the path joining to the state 2 at the (B+1)th bit, is supplied to the path memory 105 and also to the adder 181. The path metric SM2 is used by the adder 181 to determine the path metric associated with a path joining to the state 2 at the (B+2)th bit.

The selection signal SP2 is supplied not only to the selector 183 but also to the path memory 105 (FIG. 30). In accordance with the selection signal SP2, the path memory 105 selects a code sequence corresponding to the surviving path.

Although in the Viterbi detector shown in FIG. 30, a branch corresponding to an invalid transition is removed by adding the predetermined fixed value to the branch metric thereby decreasing the likelihood degree associated with the path including such a branch, a path including a branch corresponding to an invalid transition may also be removed by inhibiting the selector from selecting a path metric.

This can be accomplished by adding a previous-path processing circuit, denoted by a broken line in FIG. 31, to the ACS/state metric memory 104.

The previous-path processing circuit includes a path removal block 186, a selector 188, and a register 190.

In this case, in addition to the signals described above, the path removal block 185 also receives a removal signal PP2 which is output from the path removal block 186 and which indicates which path should be removed. The path removal block 185 controls the selector 184 so that the selector 184 does not select a path metric associated with a path indicated by the removal signal PP2. When the selector 184 is inhibited by the path removal block 185 from selecting the path metric associated with the path indicated by the removal signal PP2, if there is no remaining path which can be selected by the selector 184, that is, if there is no path joining state 2 in this case, then the path removal block 185 outputs a path existence/nonexistence indication signal PS2 indicating that there is no path to be selected, to the register 190.

The register 190 make the path existence/nonexistence indication signal PS2 from the path removal block 185 delayed by a length of time required to process one bit. The delayed no-path signal PS2 is supplied to the path removal block 186.

In addition to the path existence/nonexistence indication signal PS2 from the register 190, the path removal block 186 also receives the decision signal BL from the code path determination block 107 and the outputs of the selector 188. In addition to the counted value B from the sequence counter 108, the selector 188 also receives path existence/nonexistence indication signals PS1 and PS3 which are similar to the path existence/nonexistence indication signal PS2 which is output by the register 190 to indicate whether there is a path joining to the state 2 wherein the path existence/nonexistence indication signals PS1 and PS3 are output from blocks corresponding to the states 1 and 3 in the ACS/state metric memory 104.

The path existence/nonexistence indication signal PS1 supplied to the selector 188 indicates whether there is a path joining to the state 1 at the bit (previous bit) which has been processed in the previous step. Similarly, the path existence/nonexistence indication signal PS3 supplied to the selector 188 indicates whether there is a path joining state 3 at the bit (previous bit) which has been processed in the previous step. As in the case of the selector 187, the selector 188 selects either the path existence/nonexistence indication signal PS1 or PS3, and outputs the selected signal to the path removal block 186.

According to the path existence/nonexistence indication signal PS2, the decision signal BL, and the path existence/nonexistence indication signal supplied from the selector 188, the path removal block 186 generates a removal signal PP2 and supplies the generated signal PP2 to the path removal block 185.

As described above, the path removal block 186 outputs the removal signal PP2 indicating that the path including the invalid state transition indicated by the decision signal BL should be removed. However, if the path existence/nonexistence signal PS2 output from the register 190 or the path existence/nonexistence signal output from the register 188 indicates that there is no path that reaches either state 1 or 3 at the previous bit (one-bit previous bit), then such a path is removed even if it includes no invalid state transition.

For example, if the decision signal BL indicates that the first path includes an invalid state transition, and if the path existence/nonexistence indication signal indicates that both first and second paths exist, then the path removal block 186 outputs a removal signal PP2 indicating that the second path should be removed. On the other hand, if the decision signal BL indicates that the first path includes an invalid state transition, and if the path existence/nonexistence indication signal indicates that the second path does not exist although the first path exists, then the path removal block 186 outputs a removal signal PP2 indicating that both first and second paths should be removed. In this case, the selector 184 may select either the first path or the second path.

When the ACS/state metric memory 104 includes the previous-path processing circuit, the constant addition block 102 and the selector 103 in the Viterbi detector 7 shown in FIG. 30 are no longer necessary.

Referring again to FIG. 1, the Viterbi decoding result obtained by the Viterbi detector 7 is input to the decoder 8. The code input to the decoder 8 (FIG. 3) is supplied to the parallel-serial (P/S) converter 61 and temporarily stored therein. When all 20 bits of the code have been stored in the P/S converter 61, the P/S converter 61 outputs the 20-bit code in the parallel form to the deinterleaving circuit 62. The deinterleaving circuit 62 deinterleaves the 20-bit code into two separate 10-bit codes consisting of a sequence of even-numbered bits and a sequence of odd-numbered bits, respectively, which are then supplied to the memory 63 and the memory 64, respectively.

The memories 63 and 64 store conversion tables which are complementary to the conversion tables stored in the memories 51 and 53, respectively, shown in FIG. 2. In contrast to the memories 51 and 53 which store conversion tables including only data representing the conversion rule for either the RDS value having 3 or 5 at the start point, the memories 63 and 64 store conversion tables for both RDS values of 3 and 5.

On reception of the 10-bit codes from the deinterleaving circuit 62, the memories 63 and 64 read 8-bit data corresponding to the 10-bit codes from the respective conversion tables, and output them as decoded results.

In the present invention, as described above, 8-bit data is encoded into a 10-bit partitioned MSN code using an RDS trellis which has a linked point at the 9th bit and which is divided into sub-trellises according to the value at the start point, in which those states which occur first are inhibited from having a value equal to either the minimum RDS value and the maximum RDS value, thereby preventing quasi-catastrophic sequences from occurring and also limiting the maximum length (Tmax) of a succession of equal codes to a small value. Furthermore, since data is encoded at the 8/10 rate, it is possible to reduce the size of the encoder and also that of the decoder compared with the case where encoding is performed at the 16/20 rate. This also allows a reduction in the length of the path memory of the Viterbi detector.

Furthermore, in the present invention, Viterbi detection is performed using a detection trellis which is not divided into sub-trellis but instead is constructed in a single form. This makes it possible to construct a Viterbi detector with a reduced size.

An invalid state transition is detected on the basis of the Hamming weights and a path including such an invalid state transition is removed thereby ensuring that no quasi-catastrophic sequences occur. This also makes it possible to apply an interleaved partitioned MSN code to PR1 in such a manner so as to have a great squared Euclidean distance in the Viterbi detection process, thus achieving higher density recording with the PR1 technique than can be achieved by the PR4 technique.

Although in the embodiment described above, a 10-bit partitioned MSN code is generated using an RDS trellis in which the maximum RDS value and the minimum RDS value are set to 7 and 1, respectively, the RDS value at the start point and at the end point are set to 3 and 5, respectively, the RDS is inhibited from having a value of 2 at the 9th bit counted from the start point if the RDS has a value of 3 at the start point, and the RDS is inhibited from having a value of 6 at the 9th bit counted from the start point if the RDS has a value of 5 at the start point, a 10-bit partitioned MSN code may also be generated using such an RDS trellis in which the difference between the maximum RDS value and the minimum RDS value is set to 6, the RDS at the start point is set to a value equal to the minimum RDS value +2 or equal to the maximum RDS value −2, the RDS at the 9th bit counted from the start point is inhibited from having a value equal to the minimum RDS value +1 if the RDS at the start point is equal to the minimum RDS value +2, the RDS at the 9th bit counted from the start point is inhibited from having a value equal to the maximum RDS value −1 if the RDS at the start point is equal to the maximum RDS value −2, and the RDS at the end point is set to a value equal to the minimum RDS value +2 or equal to the maximum RDS value −2.

In the latter case, to have Tmax equal to 5Tc, it is required that the RDS at the 2nd bit be inhibited from having a value equal to the minimum RDS value if the RDS has at the start point a value equal to the minimum RDS value +2, the RDS be inhibited from having a value equal to the maximum RDS value at the 4th bit counted from the start point, the RDS be inhibited from having a value equal to the maximum RDS value at the 2nd bit counted from the start point if the RDS has at the start point a value equal to the maximum RDS value −2, and the RDS be inhibited from having a value equal to the minimum RDS value at the 4th bit counted from the start point.

Furthermore, although in the embodiments described above, invalid state transitions are detected using the detection trellis shown in FIG. 23, invalid state transitions may also be detected using the ADS trellis shown in FIG. 22 or other trellises.

Furthermore, the technique of detecting invalid state transitions in the Viterbi detection may also be applied to partitioned MSN codes other than the partitioned MSN code obtained using a trellis having a linked point at the 9th bit according to the specific embodiment described above.

Still furthermore, although in the specific embodiment described above, Hamming weights corresponding to invalid state transitions are described in the decision table whereby invalid transitions are detected and removed, the decision table may include Hamming weights corresponding to valid state transitions instead of those corresponding to invalid state transitions whereby invalid state transitions are detected and removed.

As described above, the present invention provides the encoding method, the encoding apparatus, the decoding method, the decoding apparatus, and the recording medium, in which a 10-bit code is obtained using an RDS trellis characterized in that: when maximum and minimum values of the RDS (running digital sum) of a 10-bit code are denoted by maximum RDS value and minimum RDS value, respectively, the difference between the maximum and minimum RDS values in the RDS trellis representing the change in the RDS associated with the 10-bit code is set to 6; the RDS at the start point is set to a value equal to the minimum RDS value +2 or equal to the maximum RDS value −2; when the RDS at the start point is equal to the minimum RDS value +2, the RDS at the 9th bit counted from the start point is inhibited from having a value equal to the minimum RDS value +1; when the RDS at the start point is equal to the maximum RDS value −2, the RDS at the 9th bit counted from the start point is inhibited from having a value equal to the maximum RDS value −1; and the RDS at the end point of the RDS trellis is set to a value equal to the minimum RDS value +2 or equal to the maximum RDS value −2. This makes it possible to perform encoding and decoding without generating quasi-catastrophic sequences while limiting the maximum length of a succession of equal codes to a small value.

Furthermore, in the decoding method in the preferred mode of the invention, as described above, an invalid state transition in the detection trellis, which cannot be generated by a partitioned MSN (partitioned-matched spectral null) code, is detected on the basis of the number of 1s or 0s included in the partitioned MSN code, the invalid state transition is removed from the detection trellis, and Viterbi decoding is performed according to the resultant detection trellis. This ensures that no quasi-catastrophic sequences occur.

In the decoding apparatus in the preferred mode of the invention, as described above, a plurality of path metrics are calculated using a branch metric, and a desired path metric is selected from the plurality of path metrics. Furthermore, an invalid state transition in the detection trellis, which cannot be generated by a partitioned MSN (partitioned-matched spectral null) code, is detected on the basis of the number of 1s or 0s included in the partitioned MSN code, and the branch metric corresponding to the invalid state transition is modified in such a manner as to decrease the degree of likelihood associated with the invalid state transition thereby preventing quasi-catastrophic sequences from occurring.

In the decoding apparatus in the preferred mode of the invention, as described above, the path metric calculation means calculates a plurality of path metrics using a branch metric, and the selection means selects a desired path metric from the plurality of path metrics. Furthermore, the detection means detects an invalid state transition in the detection trellis, which cannot be generated by a partitioned MSN (partitioned-matched spectral null) code, on the basis of the number of 1s or 0s included in the partitioned MSN code, and the control means controls the selection means so that the path metric corresponding to a path including the invalid state transition is not selected. This ensures that no quasi-catastrophic sequences occur.

What is claimed is:

1. An encoding method of encoding 8-bit data into a 10-bit code using an RDS trellis in which:

the difference between a maximum RDS (running digital sum) value indicating a maximum value of the RDS associated with said 10-bit code and a minimum RDS value indicating a minimum value of the RDS associated with said 10-bit code is set to 6;

the RDS at the start point in the RDS trellis representing the change in the RDS associated with said 10-bit code is set to a value equal to the minimum RDS value +2 or equal to the maximum RDS value −2;

when the RDS at the start point is equal to the minimum RDS value +2, the RDS at the 9th bit counted from the start point is inhibited from having a value equal to the minimum RDS value +1;

when the RDS at the start point is equal to the maximum RDS value −2, the RDS at the 9th bit counted from the start point is inhibited from having a value equal to the maximum RDS value −1; and the RDS at the end point of said RDS trellis is set to a value equal to the minimum RDS value +2 or equal to the maximum RDS value −2.

2. An encoding method according to claim 1, wherein:

when said RDS at the start point is equal to the minimum RDS value +2, the RDS at the 2nd bit counted from the start point is inhibited from having a value equal to said minimum RDS value and the RDS at the 4th bit counted from the start point is inhibited from having a value equal to said maximum RDS value; and when said RDS at the start point is equal to the maximum RDS value −2, the RDS at the 2nd bit counted from the start point is inhibited from having a value equal to said maximum RDS value and the RDS at the 4th bit counted from the start point is inhibited from having a value equal to said minimum RDS value.

3. An encoding apparatus for encoding 8-bit data into a 10-bit code, comprising:

storage means for storing 8-bit data and a 10-bit code related to the respective 8-bit data;

setting means for setting the difference between a maximum RDS (running digital sum) value indicating a maximum value of the RDS associated with said 10-bit code and a minimum RDS value indicating a minimum value of the RDS associated with said 10-bit code to 6, said setting means configured to set the RDS at the start point in the RDS trellis 10-bit code to a value equal to the minimum RDS value +2 or equal to the maximum RDS value −2; and inhibiting means for inhibiting the RDS at the 9th bit counted from the start point from having a value equal to the minimum RDS value +1 when the RDS at the start point is equal to the minimum RDS value +2, and for inhibiting the 9th bit counted from the start point from having a value equal to the maximum RDS value −1 when the RDS at the start point is equal to the maximum RDS value −2;

wherein said setting means is configured to set the RDS at the end point of said RDS trellis to a value equal to the minimum RDS value +2 or equal to the maximum RDS value −2.

4. The apparatus of claim 3 wherein when said RDS at the start point is equal to the minimum RDS value +2, said inhibiting means is configured to inhibit the RDS at the 2nd bit counted from the start point from having a value equal to said minimum RDS value and to inhibit the RDS at the 4th bit counted from the start point from having a value equal to said maximum RDS value; and further wherein when said RDS at the start point is equal to the maximum RDS value −2, said inhibiting means is configured to inhibit the RDS at the 2nd bit counted from the start point from having a value equal to said maximum RDS value and to inhibit the RDS at the 4th bit counted from the start point from having a value equal to said minimum RDS value.

5. A decoding method of decoding a 10-bit code into 8-bit data, characterized in that:

the difference between a maximum RDS (running digital sum) value indicating a maximum value of the RDS associated with said 10-bit code and a minimum RDS value indicating a minimum value of the RDS associated with said 10-bit code is set to 6;

the RDS at the start point in the RDS trellis representing the change in the RDS associated with said 10-bit code is set to a value equal to the minimum RDS value +2 or equal to the maximum RDS value −2;

when the RDS at the start point is equal to the minimum RDS value +2, the RDS at the 9th bit counted from the start point is inhibited from having a value equal to the minimum RDS value +1;

when the RDS at the start point is equal to the maximum RDS value −2, the RDS at the 9th bit counted from the start point is inhibited from having a value equal to the maximum RDS value −1; and the RDS at the end point of said RDS trellis is set to a value equal to the minimum RDS value +2 or equal to the maximum RDS value −2.

6. A decoding method according to claim 5, wherein:

when said RDS at the start point is equal to the minimum RDS value +2, the RDS at the 2nd bit counted from the start point is inhibited from having a value equal to said minimum RDS value and the RDS at the 4th bit counted from the start point is inhibited from having a value equal to said maximum RDS value; and If when said RDS at the start point is equal to the maximum RDS value −2, the RDS at the 2nd bit counted from the start point is inhibited from having a value equal to said maximum RDS value and the RDS at the 4th bit counted from the start point is inhibited from having a value equal to said minimum RDS value.

7. A decoding apparatus for decoding a 10-bit code into 8-bit data, comprising:

storage means for storing all possible 10-bit codes and also 8-bit data related to the respective 10-bit code;

setting means for setting the difference between a maximum RDS (running digital sum) value indicating a maximum value of the RDS associated with said 10-bit code and a minimum RDS value indicating a minimum value of the RDS associated with said 10-bit code to 6, said setting means further configured to set the RDS at the start point in the RDS trellis representing the change in the RDS associated with said 10-bit code to a value equal to the minimum RDS value +2 or equal to the maximum RDS value −2; and inhibiting means for inhibiting the RDS at the 9th bit counted from the start point from having a value equal to the minimum RDS value +1 when the RDS at the start point is equal to the minimum RDS value +2, and for inhibiting the RDS at the 9th bit counted from the start point from having a value equal to the maximum RDS value −1 when the RDS at the start point is equal to the maximum RDS value −2, wherein the setting means is configured to set the RDS at the end point of said RDS trellis to a value equal to the minimum RDS value +2 or equal to the maximum RDS value −2.

8. The apparatus of claim 7 wherein when said RDS at the start point is equal to the minimum RDS value +2, said inhibiting means is configured to inhibit the RDS at the 2nd bit counted from the start point from having a value equal to said minimum RDS value and to inhibit the RDS at the 4th bit counted from the start point is inhibited from having a value equal to said maximum RDS value; and further wherein when said RDS at the start point is equal to the maximum RDS value 2, said inhibiting means is configured to inhibit the RDS at the 2nd bit counted from the start point from having a value equal to said maximum RDS value and to inhibit the RDS at the 4th bit counted from the start point from having a value equal to said minimum RDS value.

9. A recording medium on which a 10-bit code obtained by encoding 8-bit data is recorded for use in a data reproduction method said recording medium being characterized in that said 10-bit code is generated using an RDS trellis, and further, said data reproduction method characterized in that the difference between a maximum RDS (running digital sum) value indicating a maximum value of the RDS associated with said 10-bit code and a minimum RDS value indicating a minimum value of the RDS associated with said 10-bit code is set to 6;

the RDS at the start point in the RDS trellis representing the change in the RDS associated with said 10-bit code is set to a value equal to the minimum RDS value +2 or equal to the maximum RDS value −2;

when the RDS at the start point is equal to the minimum RDS value +2, the RDS at the 9th bit counted from the start point is inhibited from having a value equal to the minimum RDS value +1;

when the RDS at the start point is equal to the maximum RDS value 2, the RDS at the 9th bit counted from the start point is inhibited from having a value equal to the maximum RDS value −1; and the RDS at the end point of said RDS trellis is set to a value equal to the minimum RDS value +2 or equal to the maximum RDS value −2.

10. The medium of claim 9 wherein the RDS trellis used to generate said 10-bit code in said data reproduction method is further characterized in that:

when said RDS at the start point is equal to the minimum RDS value +2, the RDS at the 2nd bit counted from the start point is inhibited from having a value equal to said minimum RDS value and the RDS at the 4th bit counted from the start point is inhibited from having a value equal to said maximum RDS value; and when said RDS at the start point is equal to the maximum RDS value −2, the RDS at the 2nd bit counted from the start point is inhibited from having a value equal to said maximum RDS value and the RDS at the 4th bit counted from the start point is inhibited from having a value equal to said minimum RDS value.

11. A decoding method of decoding a partial response code into an original partitioned MSN (matched spectral null) code by means of Viterbi decoding according to a detection trellis representing state transitions, said partial response code being obtained by applying a partial response characteristic represented by a transfer polynomial in the form of (1+D)n, where D is a bit-period delay operator, and n is a positive integer, to said partitioned MSN code, said method comprising the steps of:

detecting an invalid state transition in said detection trellis, which cannot be generated by said partitioned MSN code, on the basis of the number of 1s or 0s included in said partitioned MSN code;

removing said invalid state transition from said detection trellis; and performing said Viterbi decoding according to the resultant detection trellis;

wherein said partitioned MSD code is a 10-bit code;

wherein the difference between a maximum RDS (running digital sum) value indicating a maximum value of the RDS associated with said 10-bit code and a minimum RDS value indicating a minimum value of the RDS associated with said 10-bit code is set to 6;

wherein the RDS at the start point in the RDS trellis representing the change in the RDS associated with said 10-bit code is set to a value equal to the minimum RDS value +2 or equal to the maximum RDS value −2;

wherein when the RDS at the start point is equal to the minimum RDS value +2, the RDS at the 9th bit counted from the start point is inhibited from having a value equal to the minimum RDS value +1;

wherein when the RDS at the start point is equal to the maximum RDS value −2, the RDS at the 9th bit counted from the start point is inhibited from having a value equal to the maximum RDS value −1; and further wherein the RDS at the end point of said RDS trellis is set to a value equal to the minimum RDS value +2 or equal to the maximum RDS value −2.

12. The method of claim 11, wherein when said RDS at the start point is equal to the minimum RDS value +2, the RDS at the 2nd bit counted from the start point is inhibited from having a value equal to said minimum RDS value and the RDS at the 4th bit counted from the start point is inhibited from having a value equal to said maximum RDS value; and further wherein when said RDS at the start point is equal to the maximum RDS value −2, the RDS at the 2nd bit counted from the start point is inhibited from having a value equal to said maximum RDS value and the RDS at the 4th bit counted from the start point is inhibited from having a value equal to said minimum RDS value.

13. The method of claim 12 wherein the same detection trellis is used regardless of the RDS value at the start point in the RDS trellis representing RDS values of the partitioned MSN code.

14. The method of claims 13 wherein said step of removing said invalid state transition includes the step of decreasing the degree of likelihood of said invalid state transition.

15. The method of claim 14 wherein said step of removing said invalid state transition includes the step of inhibiting said invalid state transition from being selected.

16. The method of claim 15 wherein said step of detecting said invalid state transition includes the step of detecting said invalid state transition at a predetermined number-th bit counted from the start point in the RDS trellis representing the RDS values associated with said partitioned MSN code.

17. The method of claim 11 wherein the same detection trellis is used regardless of the RDS value at the start point in the RDS trellis representing RDS values of the partitioned MSN code.

18. The method of claims 17 wherein said step of removing said invalid state transition includes the step of decreasing the degree of likelihood of said invalid state transition.

19. The method of claim 18 wherein said step of removing said invalid state transition includes the step of inhibiting said invalid state transition from being selected.

20. The method of claim 19 wherein said step of detecting said invalid state transition includes the step of detecting said invalid state transition at a predetermined number-th bit counted from the start point in the RDS trellis representing the RDS values associated with said partitioned MSN code.

21. The method of claims 11 wherein said step of removing said invalid state transition includes the step of decreasing the degree of likelihood of said invalid state transition.

22. The method of claim 21 wherein said step of removing said invalid state transition includes the step of inhibiting said invalid state transition from being selected.

23. The method of claim 19 wherein said step of detecting said invalid state transition includes the step of detecting said invalid state transition at a predetermined number-th bit counted from the start point in the RDS trellis representing the RDS values associated with said partitioned MSN code.

24. The method of claim 11 wherein said step of removing said invalid state transition includes the step of inhibiting said invalid state transition from being selected.

25. The method of claim 19 wherein said step) of detecting said invalid state transition includes the step of detecting said invalid state transition at a predetermined number-th bit counted from the start point in the RDS trellis representing the RDS values associated with said partitioned MSN code.

26. The method of claim 19 wherein said step of detecting said invalid state transition includes the step of detecting said invalid state transition at a predetermined number-th bit counted from the start point in the RDS trellis representing the RDS values associated with said partitioned MSN code.

27. A decoding apparatus for decoding a partial response code into an original partitioned MSN (matched spectral null) code by means of Viterbi decoding according to a detection trellis representing state transitions, said partial response code being obtained by applying a partial response characteristic represented by a transfer polynomial in the form of $(1+D)n$, where D is a bit-period delay operator, and n is a positive integer, to said partitioned MSN code, comprising:

a detection unit for detecting an invalid state transition in said detection trellis which cannot be generated by said partitioned MSN code on the basis of the number of 1s or 0s included in said partitioned MSN code;

a controller for removing said invalid state transition from said detection trellis; and a Viterbi decoder for performing Viterbi decoding according to the resultant detection trellis;

wherein said partitioned MSD code is a 10-bit code;

wherein the difference between a maximum RDS (running digital sum) value indicating a maximum value of the RDS associated with said 10-bit code and a minimum RDS value indicating a minimum value of the RDS associated with said 10-bit code is set to 6;

wherein the RDS at the start point in the RDS trellis representing the change in the RDS associated with said 10-bit code is set to a value equal to the minimum RDS value +2 or equal to the maximum RDS value −2;

wherein when the RDS at the start point is equal to the minimum RDS value +2, the RDS at the 9th bit counted from the start point is inhibited from having a value equal to the minimum RDS value +1;

wherein when the RDS at the start point is equal to the maximum RDS value −2, the RDS at the 9th bit counted from the start point is inhibited from having a value equal to the maximum RDS value −1; and further wherein the RDS at the end point of said RDS trellis is set to a value equal to the minimum RDS value +2 or equal to the maximum RDS value −2.

28. The apparatus of claim 27, wherein when said RDS at the start point is equal to the minimum RDS value +2, the RDS at the 2nd bit counted from the start point is inhibited from having a value equal to said minimum RDS value and the RDS at the 4th bit counted from the start point is inhibited from having a value equal to said maximum RDS value; and further wherein when said RDS at the start point is equal to the maximum RDS value −2, the RDS at the 2nd bit counted from the start point is inhibited from having a value equal to said maximum RDS value and the RDS at the 4th bit counted from the start point is inhibited from having a value equal to said minimum RDS value.

29. The apparatus of claim 28 wherein the same detection trellis is used regardless of the RDS value at the start point in the RDS trellis representing RDS values of the partitioned MSN code.

30. The apparatus of claims 29 wherein said invalid state transition is removed by decreasing the degree of likelihood of said invalid state transition.

31. The apparatus of claim 30 wherein said invalid state transition is removed by inhibiting said invalid state transition from being selected.

32. The apparatus of claim 31 wherein said invalid state transition is detected at a predetermined number-th bit counted from the start point in the RDS trellis representing the RDS values associated with said partitioned MSN code.

33. The apparatus of claim 27 wherein the same detection trellis is used regardless of the RDS value at the start point in the RDS trellis representing RDS values of the partitioned MSN code.

34. The apparatus of claims 33 wherein said invalid state transition is removed by decreasing the degree of likelihood of said invalid state transition.

35. The apparatus of claim 34 wherein said invalid state transition is removed by inhibiting said invalid state transition from being selected.

36. The apparatus of claim 35 wherein said invalid state transition is detected at a predetermined number-th bit counted from the start point in the RDS trellis representing the RDS values associated with said partitioned MSN code.

37. The apparatus of claims 27 wherein said invalid state transition is removed by decreasing the degree of likelihood of said invalid state transition.

38. The apparatus of claim 37 wherein said invalid state transition is removed by inhibiting said invalid state transition from being selected.

39. The apparatus of claim 38 wherein said invalid state transition is detected at a predetermined number-th bit counted from the start point in the RDS trellis representing the RDS values associated with said partitioned MSN code.

40. The apparatus of claim 27 wherein said invalid state transition is removed by inhibiting said invalid state transition from being selected.

41. The apparatus of claim 40 wherein said invalid state transition is detected at a predetermined number-th bit counted from the start point in the RDS trellis representing the RDS values associated with said partitioned MSN code.

42. The apparatus of claim 27 wherein said invalid state transition is detected at a predetermined number-th bit counted from the start point in the RDS trellis representing the RDS values associated with said partitioned MSN code.

* * * * *